US 12,507,569 B2

(12) United States Patent
Sung et al.

(10) Patent No.: US 12,507,569 B2
(45) Date of Patent: Dec. 23, 2025

(54) ELECTRONIC DEVICE AND METHOD OF MANUFACTURING THE SAME

(71) Applicant: Samsung Display Co., Ltd., Yongin-Si (KR)

(72) Inventors: Woo Yong Sung, Yongin-si (KR); Seungyong Song, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 25 days.

(21) Appl. No.: 18/444,784

(22) Filed: Feb. 19, 2024

(65) Prior Publication Data
US 2024/0431175 A1 Dec. 26, 2024

(30) Foreign Application Priority Data

Jun. 26, 2023 (KR) .................. 10-2023-0082038

(51) Int. Cl.
*H10K 59/40* (2023.01)
*G06F 3/044* (2006.01)
(Continued)

(52) U.S. Cl.
CPC ........... *H10K 59/40* (2023.02); *G06F 3/0446* (2019.05); *H10K 59/1201* (2023.02);
(Continued)

(58) Field of Classification Search
CPC .. H10K 59/40; H10K 59/1201; H10K 59/122; H10K 59/1315; H10K 59/873;
(Continued)

(56) References Cited

U.S. PATENT DOCUMENTS 9,367,162 B2    6/2016  Lee
9,501,165 B2   11/2016  Kim et al.
(Continued)

FOREIGN PATENT DOCUMENTS

CN    116056510 A    5/2023
CN    116075171 A    5/2023
(Continued)

*Primary Examiner* — William Lu
(74) *Attorney, Agent, or Firm* — Innovation Counsel LLP

(57) ABSTRACT

An electronic device is disclosed that includes a base layer, a pixel defining film disposed on the base layer and having a light emitting opening defined therein, a barrier rib disposed on the pixel defining film, having conductivity, and including a first portion having a first barrier rib opening corresponding to the light emitting opening and a second portion insulated from the first portion, a light emitting element disposed in the light emitting opening and including an anode, an intermediate layer disposed on the anode, and a cathode disposed on the intermediate layer and connected to the first portion, a first encapsulation layer covering the cathode, a second encapsulation layer covering the light emitting opening and the first barrier rib opening, a third encapsulation layer disposed on the second encapsulation layer, and a sensor disposed on the light emitting element and including a first sensor electrode and a second sensor electrode, wherein the sensor includes a first conductive layer disposed between the second encapsulation layer and the third encapsulation layer and a second conductive layer disposed on the third encapsulation layer, and the first conductive layer is electrically connected to the second portion through the first encapsulation layer.

26 Claims, 24 Drawing Sheets

(51) Int. Cl.
  *H10K 59/12* (2023.01)
  *H10K 59/122* (2023.01)
  *H10K 59/131* (2023.01)
  *H10K 59/80* (2023.01)
  *H10K 71/20* (2023.01)

(52) U.S. Cl.
  CPC ....... *H10K 59/122* (2023.02); *H10K 59/1315* (2023.02); *H10K 59/873* (2023.02); *H10K 71/231* (2023.02)

(58) Field of Classification Search
  CPC ........... H10K 71/231; H10K 59/80522; H10K 71/00; H10K 59/131; G06F 3/0446; G06F 3/0412; G06F 3/044
  See application file for complete search history.

(56) References Cited

U.S. PATENT DOCUMENTS

| | | | |
|---|---|---|---|
| 10,103,354 | B2 | 10/2018 | Son et al. |
| 10,879,316 | B2 | 12/2020 | Lee et al. |
| 10,978,677 | B2 * | 4/2021 | Kim ...................... H10K 59/122 |
| 11,348,983 | B1 * | 5/2022 | Choung ........... H10K 59/80522 |
| 11,693,507 | B2 * | 7/2023 | Lee ........................ H10K 59/40 |
| | | | 345/174 |
| 12,029,094 | B2 * | 7/2024 | Choi ..................... G06F 3/0446 |
| 2005/0236991 | A1 * | 10/2005 | Song ........................ H01J 9/241 |
| | | | 445/24 |
| 2007/0152575 | A1 * | 7/2007 | Lee ...................... H10K 59/122 |
| | | | 313/506 |
| 2007/0284595 | A1 * | 12/2007 | Choi ..................... H10K 59/805 |
| | | | 257/E51.022 |
| 2009/0153033 | A1 * | 6/2009 | Lee ...................... H10K 71/231 |
| | | | 313/504 |
| 2010/0149133 | A1 * | 6/2010 | Woo ...................... G06F 3/0428 |
| | | | 345/175 |
| 2011/0057908 | A1 * | 3/2011 | Park ........................ G06F 3/042 |
| | | | 349/24 |
| 2020/0091247 | A1 * | 3/2020 | Lee ........................ G06F 3/0446 |
| 2021/0408163 | A1 * | 12/2021 | Heo ...................... H10K 59/353 |
| 2022/0069014 | A1 * | 3/2022 | Choi ..................... G06F 3/0446 |
| 2022/0075469 | A1 * | 3/2022 | Xia ....................... G06F 3/0446 |
| 2022/0328733 | A1 * | 10/2022 | Hwang .................. C09K 11/02 |
| 2024/0023413 | A1 * | 1/2024 | Kim ..................... H10K 59/1201 |
| 2024/0172485 | A1 * | 5/2024 | Jang ..................... H10K 50/844 |
| 2024/0331633 | A1 | 10/2024 | Qiu et al. |
| 2024/0334764 | A1 * | 10/2024 | Tang ..................... H10K 59/122 |

FOREIGN PATENT DOCUMENTS

| | | | | |
|---|---|---|---|---|
| KR | 10-2009807 | B1 | 8/2019 | |
| KR | 10-2020-0091059 | A | 7/2020 | |
| KR | 20210085287 | A * | 7/2021 | ........... G06F 3/0412 |
| KR | 10-2022-0000605 | A | 1/2022 | |

* cited by examiner

ELECTRONIC DEVICE AND METHOD OF MANUFACTURING THE SAME

CROSS-REFERENCE TO RELATED APPLICATIONS

This U.S. non-provisional patent application claims priority under 35 U.S.C. § 119 of Korean Patent Application No. 10-2023-0082038, filed on Jun. 26, 2023, the entire contents of which are hereby incorporated by reference.

BACKGROUND

The present disclosure relates to an electronic device and a method of manufacturing the same.

Electronic devices include display panels which display images. There are a wide variety of display panels such as a liquid crystal display panel, an organic light emitting display panel, an electrowetting display panel, and an electrophoretic display panel.

An organic light emitting display panel may include an organic light emitting diode having an anode, a cathode, and a light emitting pattern disposed between the anode and the cathode. A light emitting region that includes the light emitting pattern may be separated from other light emitting regions. The anode may provide a driving current to the light emitting pattern and the cathode may provide a common voltage for the light emitting pattern.

In addition, electronic devices may include input sensors that enable users to readily and intuitively enter information or commands by touch, in addition to typical input modes such as buttons, keyboards, and mouses.

SUMMARY

The present disclosure may provide an electronic device including a light emitting element formed without using a metal mask and an electronic panel including the light emitting element, and a method of manufacturing the electronic device.

The present disclosure may provide an electronic device including a light emitting element having improved process reliability and an electronic panel including the light emitting element, and a method of manufacturing the electronic device.

The present disclosure may provide an electronic device capable of downsizing products, and a method of manufacturing the electronic device.

An embodiment of an electronic device includes a base layer, a pixel defining film disposed on the base layer and having a light emitting opening defined therein, a barrier rib disposed on the pixel defining film, having conductivity, and including a first portion having a first barrier rib opening corresponding to the light emitting opening and a second portion insulated from the first portion, a light emitting element disposed in the light emitting opening and including an anode, an intermediate layer disposed on the anode, and a cathode disposed on the intermediate layer and connected to the first portion, a first encapsulation layer covering the cathode, a second encapsulation layer covering the light emitting opening and the first barrier rib opening, a third encapsulation layer disposed on the second encapsulation layer, and a sensor disposed on the light emitting element and including a first sensor electrode and a second sensor electrode, wherein the sensor includes a first conductive layer disposed between the second encapsulation layer and the third encapsulation layer and a second conductive layer disposed on the third encapsulation layer, and the first conductive layer is electrically connected to the second portion through the first encapsulation layer.

In an embodiment, in the barrier rib when viewed on a plane, a second barrier rib opening spaced apart from the first barrier rib opening may be defined, the second portion may overlap the second barrier rib opening, and the first portion and the second portion may be spaced apart.

In an embodiment, a distance between the first portion and the second portion may be less than or equal to a thickness of the first encapsulation layer.

In an embodiment, an air layer may be disposed between the first portion and the second portion.

In an embodiment, at least one of an inorganic material or an organic material may be disposed between the first portion and the second portion.

In an embodiment, a plurality of grooves spaced apart may be defined between the first portion and the second portion.

In an embodiment, the first sensor electrode may include a plurality of first sensor patterns arranged along a first direction, and a plurality of first connection patterns arranged along the first direction and each disposed between the first sensor patterns to connect adjacent first sensor patterns among the first sensor patterns, the second sensor electrode may include a plurality of second sensor patterns arranged along a second direction crossing the first direction, and a plurality of second connection patterns arranged along the second direction and each disposed between the second sensor patterns to connect adjacent second sensor patterns among the second sensor patterns, and the first connection patterns and the second connection patterns may be disposed on different layers.

In an embodiment, the first sensor patterns and the second sensor patterns may be disposed on different layers.

In an embodiment, the barrier rib may include a lower layer including a conductive material, and an upper layer disposed on the lower layer and including a conductive material.

In an embodiment, the first portion may have an undercut shape in a cross-section, and the cathode may be in contact with the first portion.

In an embodiment, the barrier rib may include a first barrier rib disposed on the pixel defining film and defining a lower barrier rib opening, and a second barrier rib disposed on the first barrier rib and defining an upper barrier rib opening overlapping the lower barrier rib opening.

In an embodiment, the first barrier rib may include a first lower layer including a conductive material, and a first upper layer disposed on the first lower layer and including a conductive material, and the second barrier rib may include a second lower layer disposed on the first upper layer and including a different material from the first lower layer, and a second upper layer disposed on the second lower layer and including a conductive material.

In an embodiment, the first lower layer and the second lower layer may have an undercut shape in a cross-section, and the cathode may be in contact with the first lower layer.

In an embodiment, the pixel defining film may have an undercut shape in a cross-section.

An embodiment of an electronic device includes a base layer, a pixel defining film disposed on the base layer and having a light emitting opening defined therein, a barrier rib disposed on the pixel defining film, having conductivity, and having a barrier rib opening corresponding to the light emitting opening defined therein, a light emitting element disposed in the light emitting opening and including an anode, an intermediate layer disposed on the anode, and a cathode disposed on the intermediate layer and connected to the barrier rib, a first encapsulation layer covering the cathode, a second encapsulation layer covering the light emitting opening and the barrier rib opening, a first conductive layer disposed on the second encapsulation layer, a third encapsulation layer disposed on the second encapsulation layer, and a second conductive layer disposed on the third encapsulation layer, wherein the barrier rib includes a first portion connected to the cathode, and a second portion insulated from the first portion and connected to the first conductive layer.

In an embodiment, at least a portion of the first conductive layer may pass through the first encapsulation layer and the second encapsulation layer and may contact the second portion.

In an embodiment, a distance between the first portion and the second portion may be less than or equal to a thickness of the first encapsulation layer.

In an embodiment, an air layer may be disposed between the first portion and the second portion.

In an embodiment, the first portion may have an undercut shape in a cross-section, and the cathode may be in contact with the first portion.

An embodiment of a method of manufacturing an electronic device includes providing a preliminary electronic panel including a base layer, an anode disposed on the base layer, and a preliminary pixel defining film disposed on the base layer and covering the anode, forming a barrier rib disposed on the preliminary pixel defining film and including a first portion forming a barrier rib opening and having an undercut shape, and a second portion spaced apart from the first portion, patterning the preliminary pixel defining film to form a plurality of light emitting openings overlapping the barrier rib opening and exposing at least a portion of the anode so as to form a pixel defining film, forming an intermediate layer including a light emitting material in the barrier rib opening and a cathode contacting the first portion, forming a first encapsulation layer covering the cathode, forming a second encapsulation layer covering the first encapsulation layer, forming a hole passing through the first encapsulation layer and the second encapsulation layer, and forming a first conductive layer connected to the second portion through the hole on the second encapsulation layer.

In an embodiment, the method may further include forming a third encapsulation layer covering the first conductive layer, and forming a second conductive layer on the third encapsulation layer.

In an embodiment, in the forming of the second encapsulation layer, the first encapsulation layer may be deposited with an organic material to form the second encapsulation layer.

In an embodiment, the forming of the second encapsulation layer may be performed at a temperature of 25° C. to 100° C.

In an embodiment, an angle formed between an edge portion of the second encapsulating layer and a plane may be 10° to 70°.

In an embodiment, the forming of the barrier rib may include forming a first layer on the pixel defining film, forming a second layer on the first conductive layer, a first etching process of patterning the first layer and the second layer to form a first pattern, and a second etching process of patterning to form an undercut in the first pattern.

In an embodiment, the forming of the barrier rib may include forming a first lower layer on the pixel defining film, forming a first upper layer on the first lower layer, forming a second lower layer on the first upper layer, forming a second upper layer on the second lower layer, a first etching process of patterning the first lower layer and the first upper layer to form a first pattern and patterning the second lower layer and the second upper layer to form a second pattern, and a second etching process of patterning to form an undercut in each of the first pattern and the second pattern.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
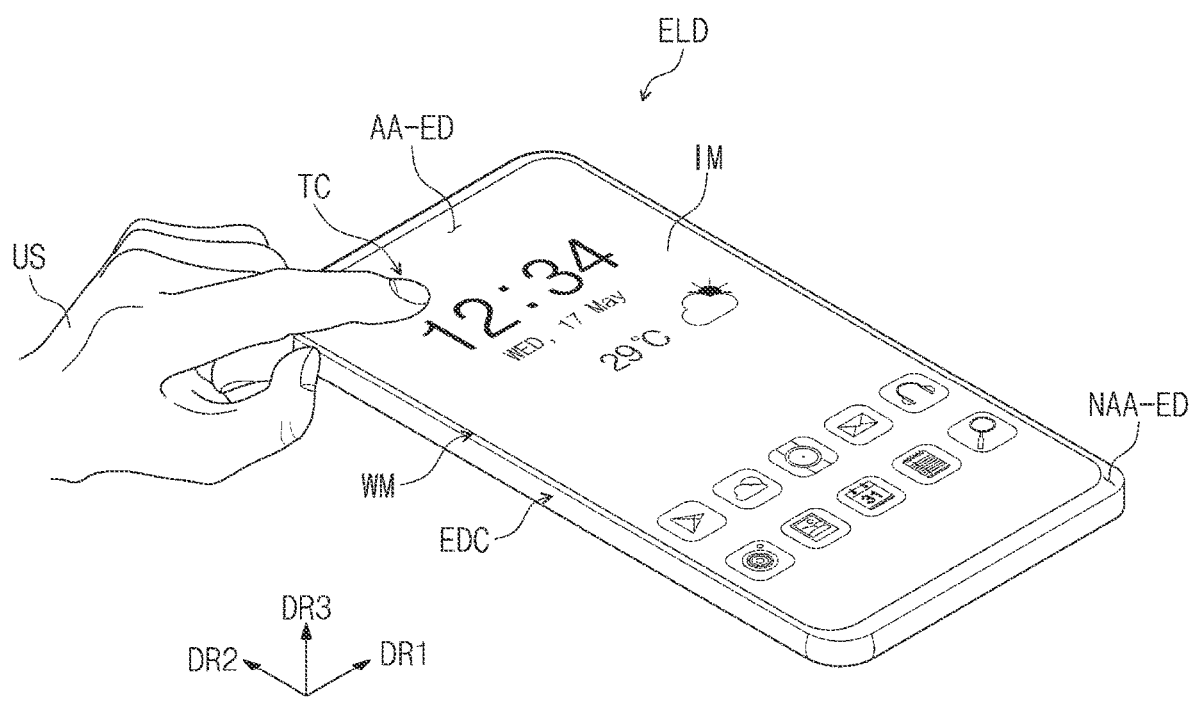
FIG. 1 is a perspective view of an electronic device according to an embodiment of the inventive concept.

As used herein, when an element (or a region, a layer, a portion, and the like) is referred to as being "on," "connected to," or "bonded to" another element, it means that the element may be directly disposed on/connected to/bonded to the other element, or that a third element may be disposed therebetween.

Like reference numerals refer to like elements. In addition, in the drawings, the thickness, the ratio, and the dimensions of elements are exaggerated for an effective description of technical contents.

It will be understood that, although the terms first, second, and the like may be used herein to describe various elements, these elements should not be limited by these terms. These terms are only used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

Also, terms of "below", "on lower side", "above", "on upper side", or the like may be used to describe the relationships of the components shown in the drawings. The terms are used as a relative concept and are described with reference to the direction indicated in the drawings.

It should be understood that the terms "comprise", "include", and "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure pertains. Also, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, a display panel according to an embodiment of the inventive concept and a method of manufacturing the display panel will be described with reference to the accompanying drawings.

Figure 2:
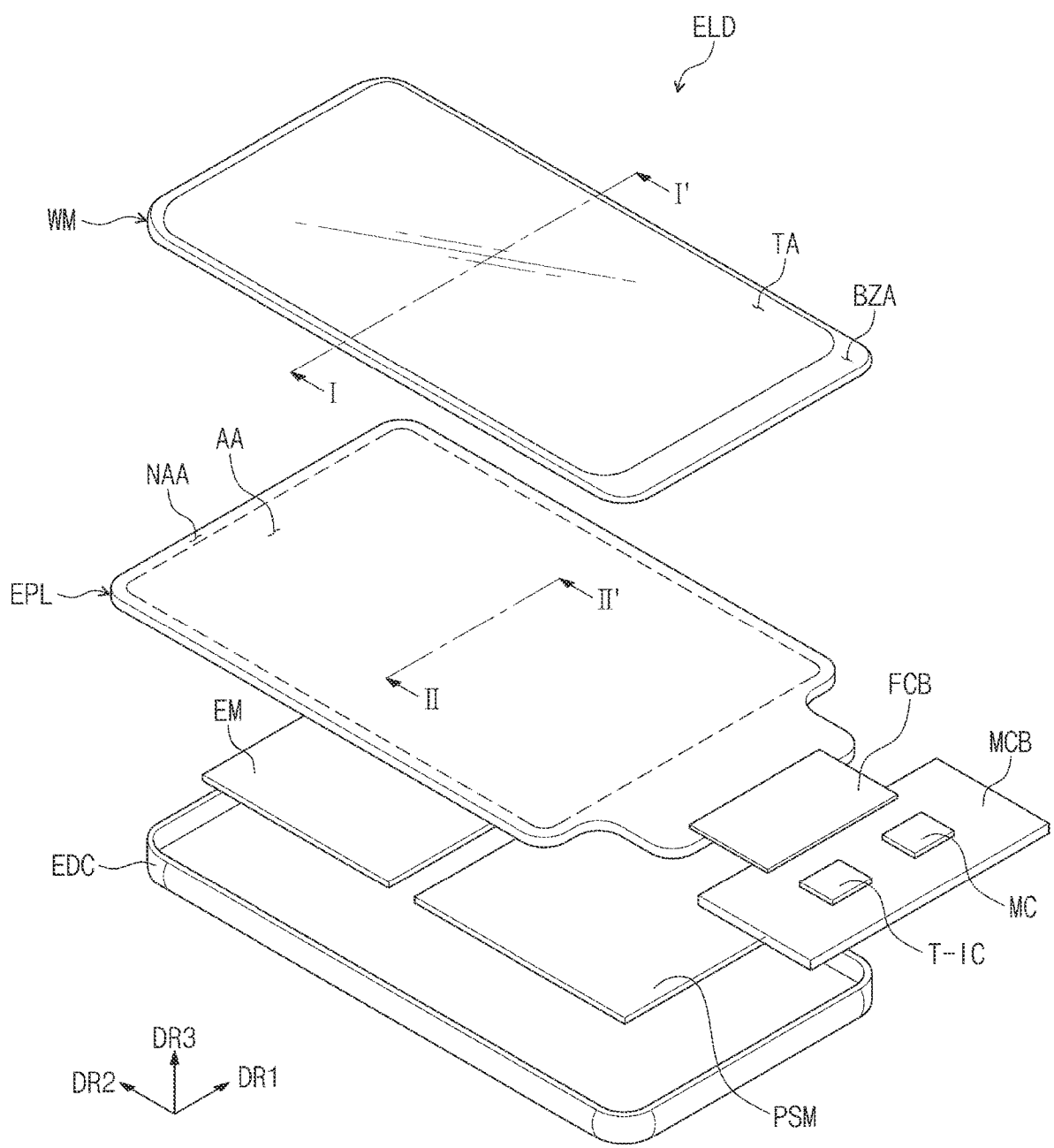
FIG. 2 is an exploded perspective view of an electronic device according to an embodiment of the inventive concept.
Figure 3:
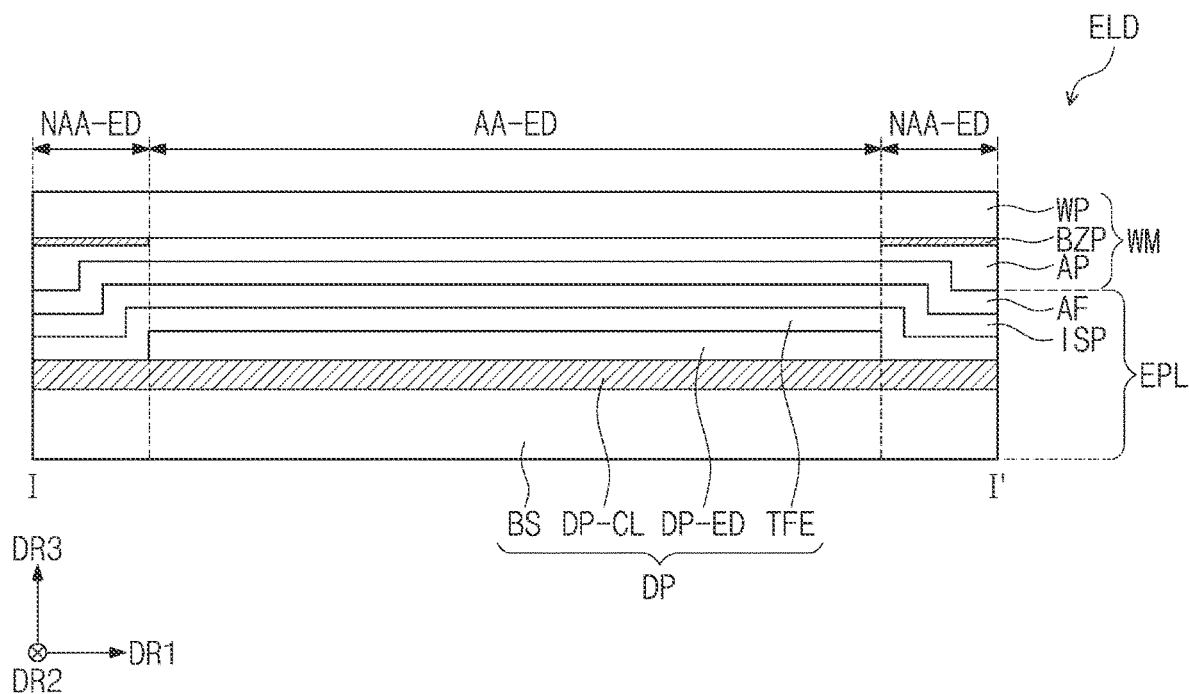
FIG. 3 is a cross-sectional view enlarging a portion of an electronic device according to an embodiment of the inventive concept.

FIG. 1 is a perspective view of an electronic device according to an embodiment of the inventive concept, FIG. 2 is an exploded perspective view of an electronic device according to an embodiment of the inventive concept, and FIG. 3 is a cross-sectional view enlarging a portion of an electronic device according to an embodiment of the inventive concept. FIG. 3 is a cross-sectional view showing a portion corresponding to line I-I' of FIG. 2.

Referring to FIG. 1, an electronic device ELD may be a device activated according to electrical signals and displaying images. For example, the electronic device ELD may not only include large-sized devices such as a television set and an outdoor billboard, but also include small- and medium-sized devices such as a monitor, a mobile phone, a tablet computer, a navigation system, and a game console. However, embodiments of the electronic device ELD are examples, and thus are not limited to any one without departing from the inventive concept.

The electronic device ELD may be rigid or flexible. "Flexible" indicates the property of being able to bend. For example, the flexible electronic device ELD may include a curved device, a rollable device, or a foldable device.

Meanwhile, FIG. 1 and the following drawings show the first to third directional axes DR1 to DR3, and directions indicated by the first to third directional axes DR1, DR2, and DR3 described herein are relative concepts, and may thus be changed to other directions. In addition, the directions indicated by the first to third directional axes DR1, DR2, and DR3 may be described as first to third directions DR1, DR2, and DR3, and the same reference numerals may be used. The first directional axis DR1 and the second directional axis DR2 herein may be perpendicular to each other, and the third directional axis DR3 may be a normal direction with respect to a plane defined by the first directional axis DR1 and the second directional axis DR2.

A thickness direction of the electronic device ELD may be parallel to the third directional axis DR3 which is a normal direction with respect to a plane defined by the first directional axis DR1 and the second directional axis DR2. As described herein, a front surface (or an upper surface) and a rear surface (or a lower surface) of members constituting the electronic device ELD may be defined with respect to the third directional axis DR3. The front surface (or upper surface) and the rear surface (or lower surface) of each member constituting the electronic device ELD may oppose each other in the third direction DR3 and a normal direction of each of the front and rear surfaces may substantially be parallel to the third direction DR3. A distance between the front surface and the rear surface defined along the third direction DR3 may correspond to a thickness of a member.

In addition, as used herein, "when viewed on a plane" may be defined as a state viewed in the third direction DR3. In addition, as used herein, "when viewed on a cross-section" may be defined as a state viewed in the first direction DR1 or the second direction DR2. Meanwhile, directions indicated by the first to third directions DR1, DR2, and DR3 are relative concepts, and may thus be changed to other directions.

The electronic device ELD according to an embodiment may display an image IM through an active region AA-ED. The active region AA-ED may include a plane defined by the first direction DR1 and the second direction DR2. The active region AA-ED may further include a curved surface bent from at least one side of the plane defined by the first direction DR1 and the second direction DR2. A surface on which the image IM is displayed may correspond to the front surface of the electronic device ELD. The image IM may include still images as well as dynamic images.

A peripheral region NAA-ED is adjacent to the active region AA-ED. The peripheral region NAA-ED may surround the active region AA-ED. Accordingly, the shape of the active region AA-ED may be substantially defined by the peripheral region NAA-ED. However, this is shown as an example, and the peripheral region NAA-ED may be disposed adjacent to only one side of the active region AA-ED, or may be omitted. The electronic device ELD according to an embodiment of the inventive concept may include various forms of active regions and is not limited to any one embodiment.

The electronic device ELD may have short sides extending in the first direction DR1 and long sides extending in the second direction DR2 crossing the first direction DR1 when viewed on a plane. However, the embodiment of the inventive concept is not limited thereto, and the electronic device ELD may have various shapes such as a circular shape and a polygonal shape.

The electronic device ELD may detect an external input TC applied from the outside. The external input TC may include various forms of inputs such as pressure, temperature, and light. In an embodiment, the external input TC are shown as touch inputs by a hand of a user US, which are applied to the front surface of the electronic device ELD. However, this is presented as an example, and the external input TC may include any inputs that bring about changes in capacitance. Of the electronic device ELD, a region for detecting the external input TC is not limited to the front surface of the electronic device ELD, and the external input TC of the user US, which is applied to a side or the rear surface of the electronic device ELD may be detected depending on the structure of the electronic device ELD.

Referring to FIGS. 1 to 3, the electronic device ELD according to an embodiment includes an electronic panel EPL. The electronic panel EPL may be configured to generate images and detect inputs applied from the outside. The electronic panel EPL according to an embodiment may include a display portion DP and a sensor portion ISP. In addition, the electronic device ELD according to an embodiment may further include an optical layer AF disposed on the electronic panel EPL.

The electronic device ELD according to an embodiment may include a window module WM disposed on the electronic panel EPL. The sensor portion ISP according to an embodiment may detect inputs applied to the window module WM. In addition, the electronic device ELD may further include an electronic module EM, a power module PSM, and a housing EDC.

An active region AA and a peripheral region NAA may be defined in the electronic panel EPL according to an embodiment. The active region AA may be a region activated according to electrical signals. The peripheral region NAA may be a region adjacent to at least one side of the active region AA.

The active region AA may correspond to the active region AA-ED of the electronic device shown in FIG. 1. The peripheral region NAA may be disposed to surround the active region AA. However, the embodiment of the inventive concept is not limited thereto, and a portion of the peripheral region NAA may be omitted in an embodiment unlike what is shown in FIG. 2 and the like. The peripheral region NAA may correspond to the peripheral region NAA-ED of the electronic device shown in FIG. 1.

Figure 4:
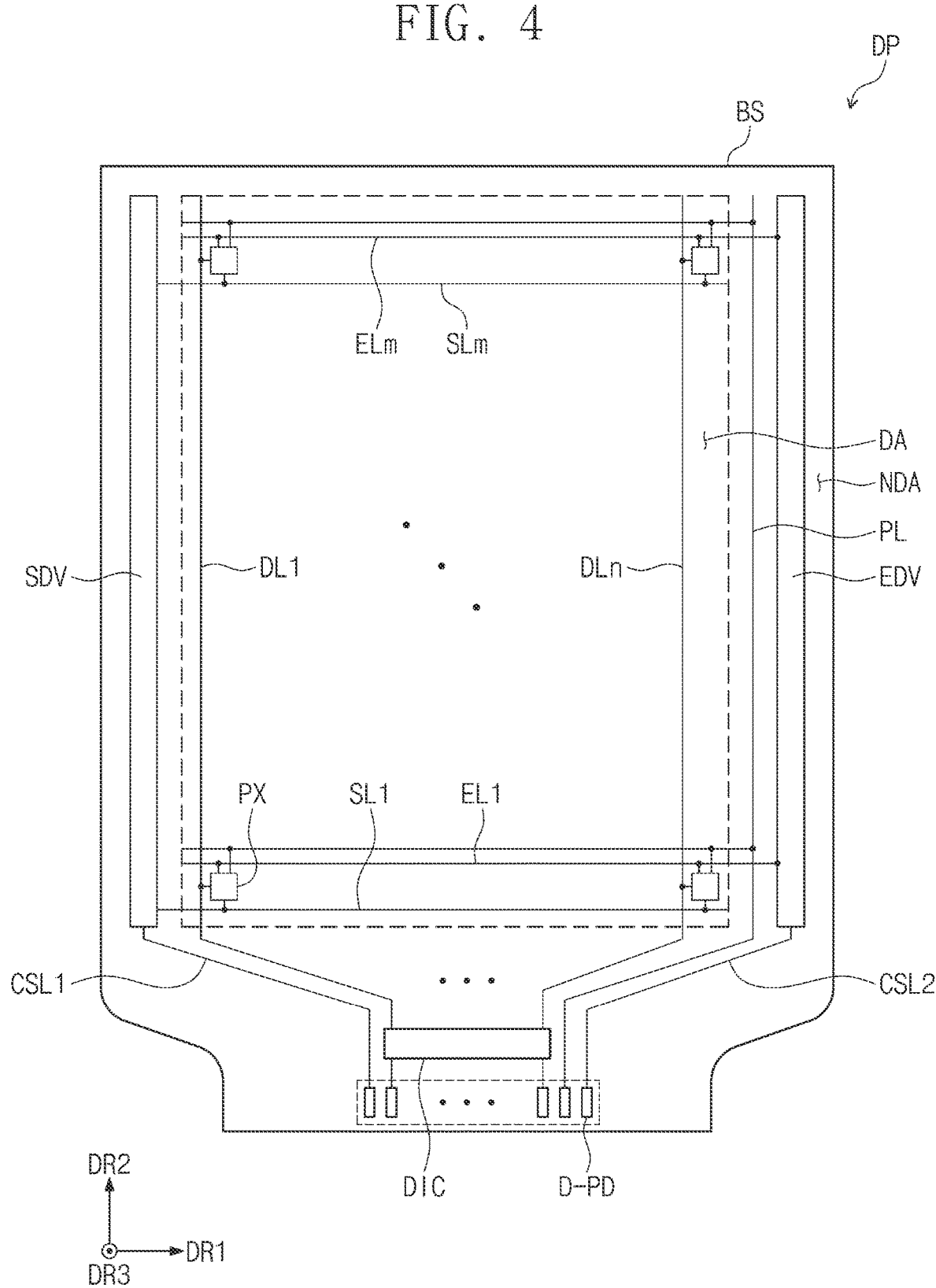
FIG. 4 is a plan view of a display portion of an electronic panel according to an embodiment of the inventive concept.
Figure 5:
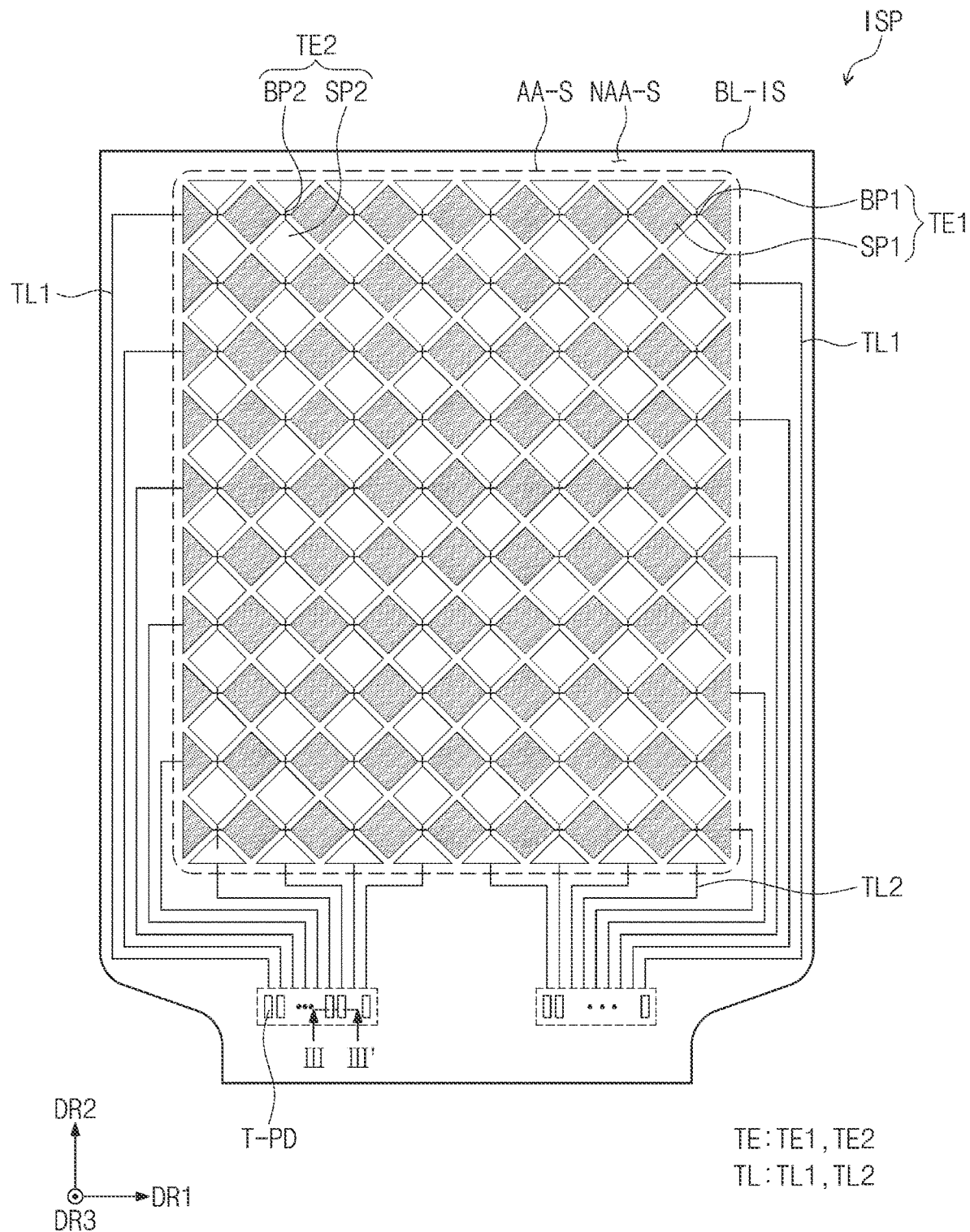
FIG. 5 is a plan view of a sensor portion of an electronic panel according to an embodiment of the inventive concept.

The electronic panel EPL according to an embodiment may include a peripheral region NAA disposed on at least one side of the active region AA, and of the peripheral region NAA, a region in which pads D-PD in FIG. 4 and T-PD in FIG. 5 are disposed may be referred to as a pad region. The pad region may be a portion of the peripheral region NAA. A driving circuit, a driving line, or the like for driving the active region AA may be disposed in the pad region.

The window module WM may be disposed on the electronic panel EPL to protect the electronic panel EPL from external shocks or scratches. The window module WMM may cover an entire outer portion of the electronic panel EPL. A front surface of the window module WMM may correspond to an upper surface of the electronic device ELD, which is described above.

In an embodiment, the window module WM may include a base substrate WP which is an optically transparent insulating material. The base substrate WP may include an optically transparent insulating material. The base substrate WP may include at least one of a glass substrate or a synthetic resin film. The base substrate WP may have a single-layer structure or a multi-layer structure in which a plurality of films are bonded. The window module WM may further include functional layers such as an anti-fingerprint layer, a phase control layer, or a hard coating layer disposed on the base substrate WP.

The window module WM may further include an adhesive layer AP. The base substrate WP and the electronic panel EPL may be bonded through the adhesive layer AP. However, the embodiment of the inventive concept is not limited thereto, and the adhesive layer AP may be omitted, and the window module WM may be directly disposed on the electronic panel EPL. Being directly disposed may indicate that a third component is disposed between the window module WM and the electronic panel EPL.

The window module WM may be divided into a transmission portion TA and a bezel portion BZA. The transmissive portion TA may correspond to the active region AA of the electronic panel EPL, and the bezel portion BZA may correspond to the peripheral region NAA of the electronic panel EPL. The bezel portion BZA may define a shape of the transmission portion TA. The bezel portion BZA may be adjacent to the transmission portion TA and may surround the transmission portion TA. However, the embodiment of the inventive concept is not limited to what is shown and the bezel portion BZA may be adjacent to only one side of the transmission portion TA and a portion thereof may be omitted.

Meanwhile, the window module WM may further include a bezel pattern BZP disposed to correspond to the bezel portion BZA. The bezel pattern BZP may be a color layer formed on one surface of the base substrate WP. The bezel pattern BZP may include a material having a color. For example, the bezel pattern BZP may include a colored organic layer. The bezel pattern BZP may have a single- or multi-layered structure. The bezel portion BZA of the window module WM on which the bezel pattern BZP is disposed may have lower light transmittance than the transmission portion TA.

The electronic device ELD may further include a main circuit board MCB, a flexible circuit film FCB, a data driver DIC (see FIG. 4), a sensor control circuit T-IC, and a main controller MC.

The main circuit board MCB may be electrically connected to the electronic panel EPL through the flexible circuit film FCB. The main circuit board MCB may be electrically connected to the electronic module EM through a connector.

The flexible circuit film FCB may be connected to the electronic panel EPL to electrically connect the electronic panel EPL with the main circuit board MCB. Meanwhile, the sensor portion ISP may be electrically connected to the display portion DP to be electrically connected to the main circuit board MCB through the flexible circuit film FCB. However, the embodiment of the inventive concept is not limited thereto, and the sensor portion ISP may be provided with the display portion DP as a singly body. Alternatively, the sensor portion ISP may be electrically connected to the main circuit board MCB through an additional flexible circuit film, or the flexible circuit film FCB may be omitted and the main circuit board MCB may be directly connected on the electronic panel EPL.

Each of the data driver DIC, the sensor control circuit T-IC, and the main controller MC may be provided in the form of an integrated chip. The data driver DIC may be mounted on the electronic panel EPL (see FIG. 4), and the sensor control circuit T-IC and the main controller MC may be mounted on the main circuit board MCB. However, the embodiment of the inventive concept is not limited thereto. For example, the data driver DIC may be mounted on the flexible circuit film FCB.

The main controller MC may control overall operations of the electronic device ELD. For example, the main controller MC may control the operation of the electronic panel EPL. Specifically, operations of the electronic panel EPL, the display portion DP, and the sensor portion ISP may each be controlled. In addition, the main controller MC may control the operation of the electronic module EM. The main controller MC may include at least one microprocessor.

The data driver DIC may include a driving circuit for driving pixels of the electronic panel EPL. Specifically, the data driver DIC may include a driving circuit for driving pixels of the display portion DP. The data driver DIC may receive image data and control signals from the main controller MC. For example, the control signals may include input vertical synchronizing signals, input horizontal synchronizing signals, main clocks, and data enable signals.

The sensor control circuit T-IC may provide electrical signals for driving the electronic panel EPL to the electronic panel EPL. Specifically, the sensor control circuit T-IC may provide electrical signals to the sensor portion ISP. The sensor control circuit T-IC may receive control signals such as clock signals from the main controller MC.

The electronic module EM may include various functional modules required for driving the electronic device ELD. For example, the electronic module EM may include a wireless communication module, an image input module, an audio input module, an audio output module, a memory, and an external interface module. The modules of the electronic module EM may be mounted on the main circuit board MCB or electrically connected to the main circuit board MCB through a separate flexible circuit board.

The power module PSM may be electrically connected to the electronic module EM. The power module PSM may supply power required for the overall operation of the electronic device ELD. For example, the power module PSM may include a typical battery device.

The window module WM and the housing EDC may be bonded to form an outer portion of the electronic device ELD. The window module WM and the housing EDC may be bonded to form an inner space accommodating components of the electronic device ELD. The electronic panel EPL, the flexible circuit film FCB, the main circuit board MCB, the electronic module EM, and the power module PSM may be accommodated in the inner space. A portion of the electronic panel EPL may be bent such that the flexible circuit film FCB and the main circuit board MCB face a rear surface of the electronic panel EPL and may thus be accommodated in the housing EDC.

The housing EDC may include a material having relatively high rigidity. For example, the housing EDC may include frames or plates including glass, plastic, or metal, or formed of a combination thereof. The housing EDC may absorb shocks applied from the outside or prevent foreign substances/moisture from penetrating from the outside to protect the electronic panel EPL or the like accommodated in the housing EDC.

In the electronic device ELD according to an embodiment, the display portion DP may be a component that substantially generates images. The display portion DP may be a portion or all of a light emitting display panel, and for example, the display portion DP may be a portion or all of an organic light emitting display panel, an inorganic light emitting display panel, a quantum dot display panel, a micro LED display panel, or a nano LED display panel. The display portion DP may be referred to as a display layer.

Referring to FIG. 3, the electronic panel EPL may include a display portion DP and a sensor portion ISP. The display portion DP may include a base layer BS, a circuit layer DP-CL, a light emitting element layer DP-ED, and an encapsulation layer TFE.

The base layer BS may be a member providing a base surface in which the circuit layer DP-CL is disposed. The base layer BS may be a rigid substrate, or a flexible substrate that is bendable, foldable, rollable, or the like. The base layer BS may be a glass substrate, a metal substrate, or a polymer substrate. However, the embodiment of the inventive concept is not limited thereto, and the base layer BS may be an inorganic layer, an organic layer, or a composite material layer.

The base layer BS may have a multi-layered structure. For example, the base layer BS may include a first synthetic resin layer, a multi-layered or single-layered intermediate layer, and a second synthetic resin layer disposed on the intermediate layer. The intermediate layer may be referred to as a base barrier layer. The intermediate layer may include a silicon oxide (SiOx) layer and an amorphous silicon (a-Si) layer disposed on the silicon oxide layer, but is not particularly limited thereto. For example, the intermediate layer may include at least one of a silicon oxide layer, a silicon nitride layer, a silicon oxynitride layer, or an amorphous silicon layer.

The first and second synthetic resin layers may each include a polyimide-based resin. In addition, the first and second synthetic resin layers may each include at least one among an acrylic-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. Meanwhile, herein, a "~~"-based resin indicates that a functional group of "~~" is included.

The circuit layer DP-CL may be disposed on the base layer BS. The circuit layer DP-CL may include an insulating layer, a semiconductor pattern, a conductive pattern, a signal line, and the like. The insulating layer, the semiconductor layer, and the conductive layer may be formed on the base layer BS through methods such as coating or vapor deposition, and then selectively patterned through multiple times of a photolithography process. Then, the semiconductor pattern, the conductive pattern, and the signal line included in the circuit layer DP-CL may be formed. The circuit layer DP-CL may include a plurality of inorganic insulating layers and a plurality of organic insulating layers as insulating layers.

The display element layer DP-ED may be disposed on the circuit layer DP-CL. The display element layer DP-ED may include a light emitting element. For example, the display element layer DP-ED may include organic light emitting materials, inorganic light emitting materials, organic-inorganic light emitting materials, quantum dots, quantum rods, micro LEDs, or nano LEDs. The light emitting elements of the display element layer DP-ED may be electrically connected to driving elements of the circuit layer DP-CL, and may thus generate light according to signals provided by the driving elements to display images.

The encapsulation layer TFE may be disposed on the display element layer DP-ED. The encapsulation layer TFE may serve to protect the light emitting element layer DP-ED from moisture, oxygen, and foreign substances such as dust particles. The encapsulation layer TFE may seal the light emitting elements of the display element layer DP-ED. The encapsulation layer TFE may include at least one thin film for improving optical efficiency of the display element layer DP-ED or protecting the display element layer DP-ED.

The input sensor ISP may detect the external input TC applied from the outside. The external input TC may be inputs from the user US. The inputs from the user US may include various types of external inputs such as a body part of users, light, heat, pen, or pressure. The sensor portion ISP may detect the external input TC and provide input signals including information about the external input TC so that the electronic panel EPL may generate an image IM corresponding to the external input TC. The sensor portion ISP may be driven in various ways such as a capacitive method, a resistive film method, an infrared method, a sound wave method, or a pressure method, and is not limited to any one method. In the present embodiment, the sensor portion ISP is described to be driven in the capacitive manner.

For convenience of description, the drawing shows that the sensor portion ISP is disposed on the display portion DP, but the embodiment of the inventive concept is not limited thereto, and the display portion DP and the sensor portion ISP may be provided as a single body. Specifically, not all components of the sensor portion ISP are disposed on the display portion DP. As an example, a portion of the sensor portion ISP may be disposed between some components of the display portion DP, and is not limited to any one embodiment. As will be described later, sensors of the sensor portion ISP (e.g., a conductive layer MTL (see FIG. 6A)) may be disposed between the encapsulation layers TFE of the display portion DP.

In an embodiment, the electronic panel EPL may include an optical layer AF. The optical layer AF may be disposed on the sensor portion ISP. The optical layer AF may be a reflection reducing layer that reduces reflectance by external light incident from the outside of the electronic panel EPL. The optical layer AF may be formed on the sensor portion ISP through a roll-to-roll process. For example, the optical layer AF may include a polarizing film including a phase retarder or a polarizer, multi-layered reflection layers that induces destructive interference of reflected light, or color filters disposed corresponding to the pixel arrangement and light emitting color of the display portion DP. For example, when the optical layer AF includes the color filters, the color filters may be arranged in consideration of the light emitting colors of pixels included in the display portion DP. In addition, in an embodiment, the optical layer AF may be omitted.

FIG. 4 is a plan view of an electronic panel according to an embodiment of the inventive concept. Specifically, FIG. 4 is a plan view showing a display portion of an electronic panel according to an embodiment of the inventive concept, and components of a sensor portion are omitted for convenience of description.

Referring to FIG. 4, the display portion DP may include a base layer BS, pixels PX, signal lines SL1 to SLm, DL1 to DLn, EL1 to ELm, CSL1, CSL2, and PL electrically connected to the pixels PX, a scan driver SDV, a data driver DIC, an emission driver EDV, and panel pads D-PD.

The base layer BS may provide a base surface on which elements and lines of the display portion DP are disposed. The base layer BS may include a display region DA and a non-display region NDA. The display region DA may be a region in which the pixels PX are disposed to display images. The non-display region NDA may be a region adjacent to the display region DA, in which elements and lines for driving the pixels PX are disposed and images are not displayed. The display region DA may correspond to the active region AA (see FIG. 2) of the electronic panel EPL, and the non-display region NDA may correspond to the peripheral region NAA (see FIG. 2) of the electronic panel EPL.

Each of the pixels PX may include a pixel driving circuit including transistors (e.g., a switching transistor, a driving transistor, and the like) and a capacitor, and a light emitting element electrically connected to the pixel driving circuit. The pixels PX may emit light in response to electrical signals applied to the pixels PX.

The scan driver SDV, the data driver DIC, and the emission driver EDV may each be disposed in the non-display region NDA. However, the embodiment of the inventive concept is not limited thereto, and at least one of the scan driver SDV, the data driver DIC, or the emission driver EDV may be disposed in the display region DA, and accordingly, an area of the non-display region NDA may be reduced.

The signal lines SL1 to SLm, EL1 to ELm, DL1 to DLn, CSL1, CSL2, and PL may include scan lines SL1 to SLm, data lines DL1 to DLn, light emitting lines EL1 to ELm, first and second control lines CSL1 and CSL2, and a power line PL. In this case, m and n are natural numbers greater than or equal to 1. The pixels PX may each be electrically connected to corresponding scan lines, data lines, and emission lines among the scan lines SL1 to SLm, the data lines DL1 to DLn, and the emission lines EL1 to ELm. Meanwhile, more types of signal lines may be provided in the display portion DP according to components of the pixel driving circuit of the pixels PX.

The scan lines SL1 to SLm may extend in the first direction DR1 and be electrically connected to the scan driver SDV. The data lines DL1 to DLn may extend in the second direction DR2 and be electrically connected to the data driver DIC. The light emitting lines EL1 to ELm may extend in the first direction DR1 and be electrically connected to the emission driver EDV.

The power line PL may include a portion extending in the first direction DR1 and a portion extending in the second direction DR2. The portion of the power line PL, which extends in the first direction DR1, may be disposed in the non-display region NDA. The portion of the power line PL, which extends in the second direction DR2 may be electrically connected to the pixels PX and the portion of the power line PL, which extends in the first direction DR1. The portion of the power line PL, which extends in the second direction DR2, may be disposed on a different layer from the portion extending in the first direction DR1 to be connected through a contact hole, or may be in the form of a single body with the portion extending in the first direction DR1 on the same layer.

A first control line CSL1 may be electrically connected to the scan driver SDV. A second control line CSL2 may be electrically connected to the emission driver EDV.

The panel pads D-PD may be disposed adjacent to a lower end of the non-display region NDA. The panel pads D-PD may be disposed closer to the lower end of the display portion DP than the data driver DIC. The panel pads D-PD may be disposed spaced apart along the first direction DR1. The panel pads D-PD may be portions to which a circuit board providing signals that control the operation of the scan driver SDV, data driver DIC, and emission driver EDV of the display portion DP is electrically connected.

The panel pads D-PD may be defined as display pads electrically connected to the pixels PX. The panel pads D-PD may each be connected to a corresponding signal line among the signal lines SL1 to SLm, EL1 to ELm, DL1 to DLn, CSL1, CSL2, and PL. For example, the power line PL, the first and second control lines CSL1 and CSL2, and the data lines DL1 to DLn may each be connected to corresponding panel pads D-PD. The data lines DL1 to DLn may be connected to the corresponding panel pads D-PD through the data driver DIC.

The scan driver SDV may generate scan signals in response to scan control signals. The scan signals may be applied to the pixels PX through the scan lines SL1 to SLm. The data driver DIC may generate data voltages corresponding to image signals in response to data control signals. The data voltages may be applied to the pixels PX through the data lines DL1 to DLn. The emission driver EDV may generate emission signals in response to emission control signals. The emission signals may be applied to the pixels PX through the emission lines EL1 to ELm.

The pixels PX may be provided with the data voltages in response to the scan signals. The pixels PX may display images by emitting light of luminance corresponding to the data voltages in response to the light emitting signals. The emission duration of the pixels PX may be controlled by the emission signals. Accordingly, the display portion DP may generate images on the display region DA through the pixels PX.

FIG. 5 is a plan view of an electronic panel according to an embodiment of the inventive concept. Specifically, FIG. 5 is a plan view showing a sensor portion of an electronic panel according to an embodiment of the inventive concept, and components of a display portion are omitted for convenience of description.

Referring to FIG. 5, the sensor portion ISP may include a sensing region AA-S and a non-sensing region NAA-S adjacent to the sensing region AA-S. The sensing region AA-S may correspond to the active region AA (see FIG. 2) of the electronic panel EP (see FIG. 2). The sensing region AA-S may be a region in which sensor electrodes TE of the sensor portion ISP are disposed to detect the external input TC (see FIG. 1). The non-sensing region NAA-S may correspond to the peripheral region NAA (see FIG. 2) of a display module. The non-sensing region NAA-S may be a region in which elements or lines for driving the sensor electrodes TE disposed in the sensing region AA-S are disposed.

The sensor portion ISP may include the sensor electrodes TE, sensing lines TL, and sensing pads T-PD.

The sensor electrodes TE may include first sensor electrodes TE1 and second sensor electrodes TE2 that cross each other when viewed on a plane and are electrically insulated. The sensor portion ISP may obtain information about external inputs through changes in mutual capacitance between the first sensor electrodes TE1 and the second sensor electrodes TE2.

Each of the first sensor electrodes TE1 may extend in the first direction DR1, and the first sensor electrodes TE1 may be arranged in the second direction DR2. The first sensor electrodes TE1 may be provided in a plurality of rows arranged in the second direction DR2. Although FIG. 5 shows 10 first sensor electrodes TE1 arranged in the second direction DR2 as an example, the number of first sensor electrodes TE1 included in the sensor portion ISP is not limited thereto.

Each of the second sensor electrodes TE2 may extend in the second direction DR2, and the second sensor electrodes TE2 may be arranged in the first direction DR1. The second sensor electrodes TE2 may be provided in a plurality of columns arranged in the first direction DR1. Although FIG. 6 shows 8 second sensor electrodes TE2 arranged in the first direction DR1 as an example, the number of second sensor electrodes TE2 included in the sensor portion ISP is not limited thereto.

Each of the first sensor electrodes TE1 may include first sensor patterns SP1 and first connection patterns BP1. The first sensor patterns SP1 may be arranged in the first direction DR1. The first connection patterns BP1 may connect adjacent first sensor patterns SP1 in the first direction DR1. The first connection patterns BP1 may be disposed on the same layer as the first sensor patterns SP1 and may extend from the first sensor patterns SP1 when viewed on a plane to have a single body shape. The first sensor patterns SP1 and the first connection patterns BP1 may be patterns formed by being patterned from the same conductive layer through the same process. However, the embodiment of the inventive concept is not limited thereto as long as the first connection patterns BP1 electrically connect adjacent first sensor patterns SP1 in the first direction DR1.

Each of the second sensor electrodes TE2 may include second sensor patterns SP2 and second connection patterns BP2. The second sensor patterns SP2 may be arranged in the second direction DR2. The second connection patterns BP2 may connect adjacent second sensor patterns SP2 in the second direction DR2. The second connection patterns BP2 may be disposed on a different layer from the second sensor patterns SP2 and be connected to corresponding second sensor patterns SP2 through a contact hole. The second sensor patterns SP2 spaced apart in the second direction DR2 may be electrically connected through the second connection patterns BP2. The second connection patterns BP2 disposed on a different layer from the second sensor patterns SP2 and electrically connecting the second sensor patterns SP2 may be defined as bridge patterns.

In an embodiment, the first sensor patterns SP1, the first connection patterns BP1, and the second sensor patterns SP2 may be disposed on the same layer. The second connection patterns BP2 may be disposed on a different layer from the second sensor patterns SP2. A specific positional relationship among the first sensor patterns SP1, the first connection patterns BP1, the second sensor patterns SP2, and the second connection patterns BP2 will be described later.

The sensing lines TL may include first sensing lines TL1 and second sensing lines TL2. Each of the first sensing lines TL1 may be connected to the first sensor electrodes TE1. Each of the first sensing lines TL1 may be connected to a first sensor electrode TE1 in a corresponding row among the first sensor electrodes TE1 provided in a plurality of rows. Each of the second sensing lines TL2 may be connected to the second sensor electrodes TE2. Each of the second sensing lines TL2 may be connected to a second sensor electrode TE2 in a corresponding column among the second sensor electrodes TE2 provided in a plurality of columns.

The second sensing lines TL2 may each be connected to lower ends of the second sensor electrodes TE2 adjacent to the sensing pads T-PD. The second sensing lines TL2 may extend from the lower end of the corresponding second sensor electrode TE2 on the non-sensing region NAA-S and may be connected to the sensing pads T-PD.

As shown in FIG. 5, the first sensing lines TL1 may each be connected to the left or right ends of the first sensor electrodes TE1. For example, each of the first sensing lines TL1 connected to the first sensor electrodes TE1 in odd rows among the first sensing lines TL1 may be connected to the left end of a corresponding first sensor electrode TE1 among the first sensor electrodes TE1 in odd rows. Each of the first sensing lines TL1 connected to the first sensor electrodes TE1 in even rows among the first sensing lines TL1 may be connected to the right end of a corresponding first sensor electrode TE1 among the first sensor electrodes TE1 in even rows. The first sensing lines TL1 may extend from the left end or the right end of the corresponding first sensor electrode TE1 in the second direction DR2 on the non-sensing region NAA-S to be connected to the sensing pads T-PD.

The sensing pads T-PD may be disposed in the non-sensing region NAA-S. The sensing pads T-PD may be disposed adjacent to a lower end of a sensor base layer BL-IS. The sensing pads T-PD may be electrically connected to the sensing lines TL. The sensing pads T-PD may be spaced apart and each connected to the sensing lines TL. The sensing pads T-PD may be electrically connected to a circuit board that provides driving signals. Signals may be applied to the sensor electrodes TE or signals provided from the sensor electrodes TE may be received through the sensing pads T-PD and the sensing lines TL.

In an embodiment, driving signals for driving the first sensor electrodes TE1 and the second sensor electrodes TE2 may be applied to the first sensor electrodes TE and the second sensor electrodes TE2 through the second sensing lines TL2. Signals including information detected by the first sensor electrodes TE1 and the second sensor electrodes TE2 may be output through the first sensing lines TL1. However, the embodiment of the inventive concept is not limited thereto.

Meanwhile, the sensing pads T-PD may be formed as a singly body with correspondingly connected sensing lines TL. Unlike what is shown in FIG. 5, the sensing pads T-PD may not be distinguished from the sensing lines TL, and one end of the sensing lines TL may correspond to a sensing pad portion connected to a driving chip on a circuit board or the like.

The sensing pads T-PD and the sensing lines TL may be formed from the sensor conductive layer MTL (see FIG. 6A) of an input sensor. For example, the sensing pads T-PD and the sensing lines TL may be formed in the same process as the first sensor conductive layer MTL1 (see FIG. 6C). However, the embodiment of the inventive concept is not limited thereto. Depending on the arrangement position of the sensor electrodes TE, the sensing pads T-PD and the sensing lines TL may be formed in the same process as the second sensor conductive layer MTL2 (see FIG. 6C), or some of the sensing pads T-PD and sensing lines TL may be formed in the same process as the first sensor conductive layer MTL1 and the other some may be formed in the same process as the second sensor conductive layer MTL2.

Figure 6A:
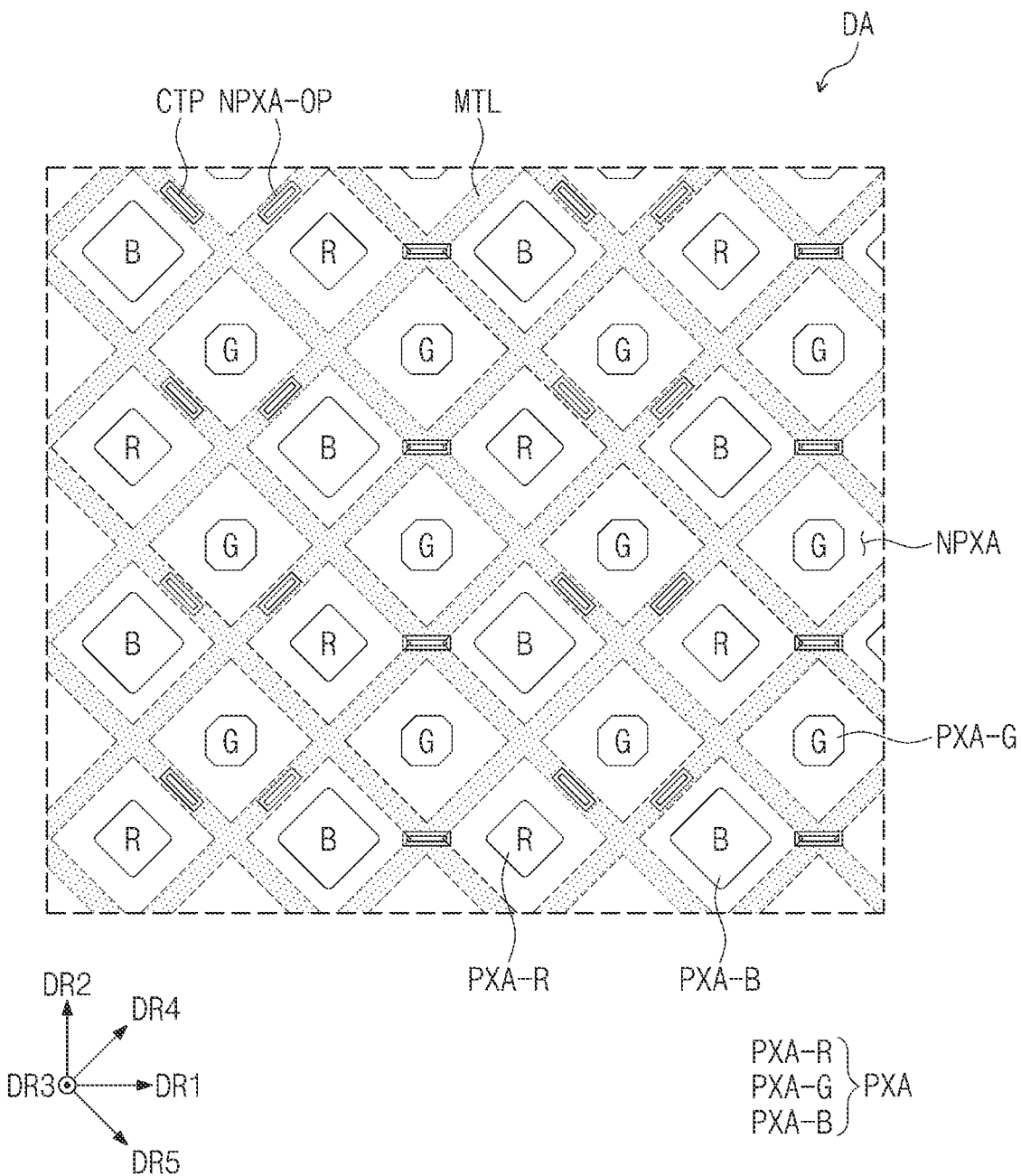
FIGS. 6A, 6B, and 6C are views enlarging a portion of an electronic panel according to an embodiment of the inventive concept.
Figure 6B:
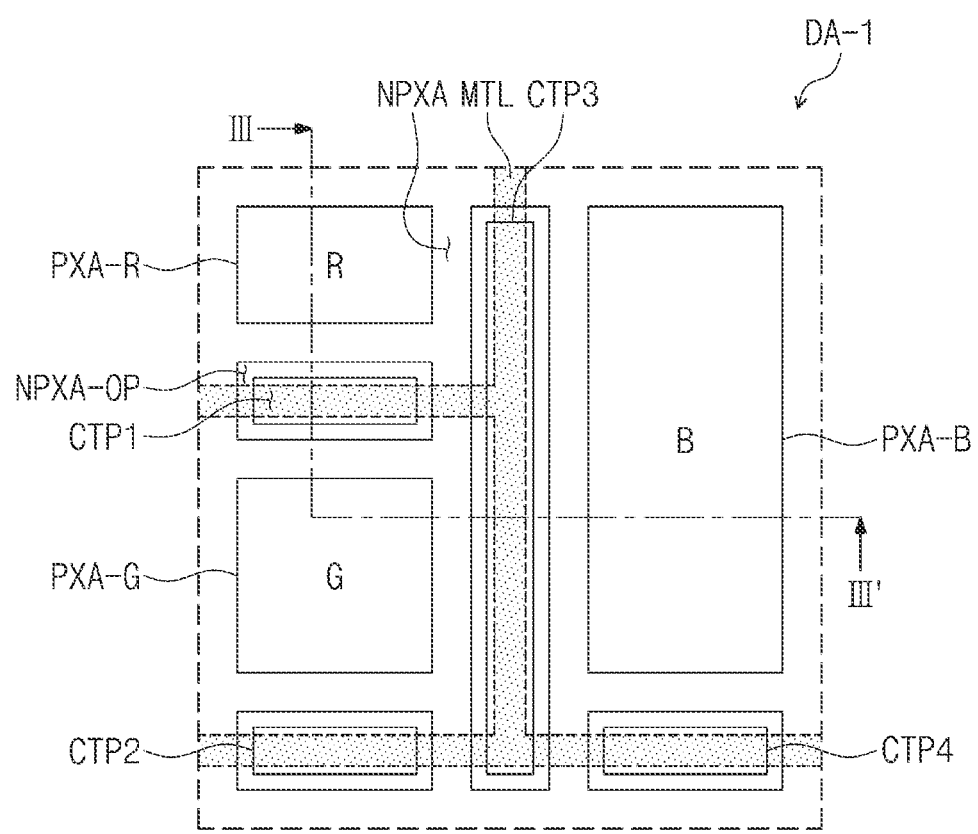
Figure 6C:
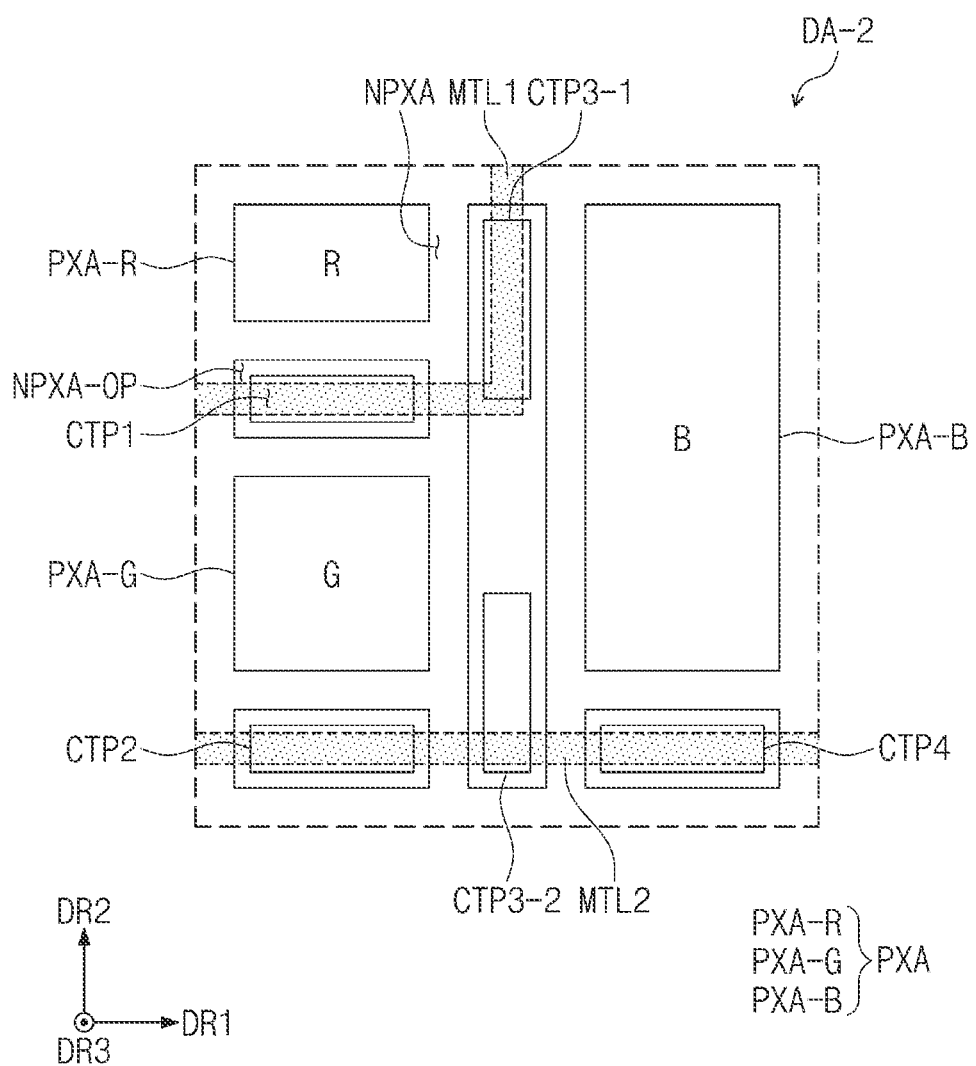

FIGS. 6A to 6C are views enlarging a portion of an electronic panel according to an embodiment of the inventive concept. Specifically, FIGS. 6A to 6C are each views enlarging a portion of an electronic panel according to different embodiments, show a plane of the electronic panel viewed from a display surface of the electronic panel, and show the arrangement of light emitting regions and the arrangement of conductive layers.

Referring to FIG. 6A, the display region DA may include first to third light emitting regions PXA-R, PXA-G, and PXA-B and a peripheral region NPXA surrounding the first to third light emitting regions PXA-R, PXA-G, and PXA-B. The first to third light emitting regions PXA-R, PXA-G, and PXA-B may each correspond to regions in which light provided from light emitting elements ED1, ED2, and ED3 (see FIG. 10B) is emitted. The first to third light emitting regions PXA-R, PXA-G, and PXA-B may be distinguished according to the color of light emitted toward the outside of the electronic panel EPL (see FIG. 2).

The first to third light emitting regions PXA-R, PXA-G, and PXA-B may provide first to third color light each having different colors. For example, the first color light may be red light, the second color light may be green light, and the third color light may be blue light. However, examples of the first to third color light are not necessarily limited to the above examples.

Each of the first to third light emitting regions PXA-R, PXA-G, and PXA-B may be defined as a region in which an upper surface of the anode is exposed by a light emitting opening OP-E (see FIG. 7A), which will be described later. The peripheral region NPXA may set a boundary among the flight emitting regions PXA-R, PXA-G, and PXA-B, and prevent the first to third light emitting regions PXA-R, PXA-G, and PXA-B from being color-mixed.

Each of the first to third light emitting regions PXA-R, PXA-G, and PXA-B may be provided in plurality and repeatedly arranged in a predetermined arrangement form in the display region DA. For example, the first and third light emitting regions PXA-R and PXA-B may be alternately arranged along the first direction DR1 to form a 'first group'. The second light emitting regions PXA-G may be arranged along the first direction DR1 to form a 'second group'. The 'first group' and the 'second group' may each be provided in plurality, and the 'first groups' and 'second groups' may be alternately arranged along the second direction DR2.

One second light emitting region PXA-G may be disposed to be spaced apart from one first light emitting region PXA-R or one third light emitting region PXA-B in a fourth direction DR4. The fourth direction DR4 may be defined as a direction between the first direction DR1 and the second direction DR2.

Meanwhile, FIG. 6A shows an arrangement form of the first to third light emitting regions PXA-R, PXA-G, and PXA-B as an example, but the arrangement form is not limited thereto and the first to third light emitting regions PXA-R, PXA-G, and PXA-B may be arranged in various forms. In an embodiment, the first to third light emitting regions PXA-R, PXA-G, and PXA-B may have an arrangement form of pentile (PENTILE®) as shown in FIG. 6A. Alternatively, the first to third light emitting regions PXA-R, PXA-G, and PXA-B may have an arrangement form of stripe or diamond (DIAMOND PIXEL®).

The first to third light emitting regions PXA-R, PXA-G, and PXA-B may have various shapes when viewed on a plane. For example, the first to third light emitting regions PXA-R, PXA-G, and PXA-B may have shapes such as a polygonal shape, a circular shape, or an elliptical shape. FIG. 6A shows first and third light emitting regions PXA-R and PXA-B having a quadrangular shape (or rhombus shape) and a second light emitting region PXA-G having an octagonal shape when viewed on a plane.

The first to third light emitting regions PXA-R, PXA-G, and PXA-B may have the same shape when viewed on a plane, or at least some of the first to third light emitting regions PXA-R, PXA-G, and PXA-B may have different shapes. FIG. 6A shows first and third light emitting regions PXA-R and PXA-B having the same shape when viewed on a plane and a second light emitting region PXA-G having a different shape from the first and third light emitting regions PXA-R and PXA-B as an example.

At least some of the first to third light emitting regions PXA-R, PXA-G, and PXA-B may have different size areas when viewed on a plane. In an embodiment, an area of the first light emitting region PXA-R emitting red light may be larger than an area of the second light emitting region PXA-G emitting green light, and may be smaller than an area of the third light emitting region PXA-B emitting blue light. However, the size relationship of the areas among the first to third light emitting regions PXA-R, PXA-G, and PXA-B according to the color of emitted light is not limited thereto, and may vary depending on the design of the electronic panel EPL (see FIG. 2). In addition, the embodiment of the inventive concept is not limited thereto, and the first to third light emitting regions PXA-R, PXA-G, and PXA-B may have the same size area when viewed on a plane.

A plurality of openings NPXA-OP may be defined in the peripheral region NPXA. A contact portion CTP may be positioned in the peripheral region NPXA. The contact portion CTP may be provided in plurality. The contact portion CTP may be positioned between each of the openings NPXA-OP. The shape and size of each of the contact portions CTP may be different or the same.

The plurality of contact portions CTP may be insulated from the first to third light emitting regions PXA-R, PXA-G, and PXA-B in the openings NPXA-OP. In addition, the plurality of contact portions CTP may be insulated from a portion of the peripheral region NPXA, which does not overlap the plurality of openings NPXA-OP when viewed on a plane.

A portion of the peripheral region NPXA, which does not overlap the plurality of openings NPXA-OP when viewed on a plane may correspond to a first portion of a barrier rib, which will be described later, and a plurality of contact portions may correspond to a second portion of a barrier rib, which will be described later.

The sensor portion ISP (see FIG. 5) may include a conductive layer MTL. The drawing shows a conductive pattern of the conductive layer MTL. Corresponding to the arrangement of the first to third light emitting regions PXA-R, PXA-G, and PXA-B, the conductive pattern of the conductive layer MTL may include a mesh pattern. The conductive pattern of the conductive layer MTL may extend in the fourth and fifth directions DR4 and DR5. Although not shown in the drawing, a cutout portion may be defined in a direction crossing an extension direction of the conductive pattern of the conductive layer MTL, and is not limited to any one embodiment.

The conductive pattern of the conductive layer MTL may overlap the peripheral region NPXA when viewed on a plane. The conductive pattern of the conductive layer MTL may be spaced apart from the first to third light emitting regions PXA-R, PXA-G, and PXA-B when viewed on a plane.

The conductive layer MTL may be electrically connected to the plurality of contact portions CTP in the openings NPXA-OP. That is, as will be described later, the conductive layer MTL may be electrically connected to the second portion of the barrier rib, which will be described later.

In addition, the extension direction of the conductive pattern of the conductive layer MTL according to an embodiment of the inventive concept is not limited to what is shown in the drawing, and the conductive pattern of the conductive layer MTL may extend in various directions as long as the conductive pattern is spaced apart from the first to third light emitting regions PXA-R, PXA-G, and PXA-B when viewed on a plane, and is not limited to one embodiment.

Referring to FIG. 6B, according to an embodiment of the inventive concept, unlike the embodiment shown in FIG. 6A, the first light emitting region PXA-R and the second light emitting region PXA-G may be spaced apart in the second direction DR2. The third light emitting region PXA-B and the first light emitting region PXA-R, and the third light emitting region PXA-B and the second light emitting region PXA-G may be spaced apart in the first direction DR1. The first to third light emitting regions PXA-R, PXA-G, and PXA-B may be in the form of an arrangement that is repeatedly identical along the first direction DR1 and the second direction DR2, and the arrangement is not limited to any one embodiment.

Depending on the arrangement of the first to third light emitting regions PXA-R, PXA-G, and PXA-B, the conductive pattern of the conductive layer MTL may be different from what is described in FIG. 6A. The conductive pattern may extend in the first direction DR1 or the second direction DR2.

The plurality of openings NPXA-OP may each be adjacent to the first to third light emitting regions PXA-R, PXA-G, and PXA-B. Referring to the drawing, the openings NPXA-OP may be positioned between the first light emitting region PXA-R and the second light emitting region PXA-G, and between the first light emitting region PXA-R and the third light emitting region PXA-B, or between the third light emitting regions PXA-B. However, the positions of the openings NPXA-OP are not limited to what is shown in the drawing and may have various embodiments.

The plurality of contact portions CTP1, CTP2, CTP3, and CTP4 may each be disposed in corresponding openings NPXA-OP. The first to fourth contact portions CTP1, CTP2, CTP3, and CTP4 may be positioned in different openings NPXA-OP and may be electrically connected to a conductive pattern of one conductive layer MTL. However, the embodiment of the inventive concept is not limited thereto, and the first to third contact portions may each be electrically connected to different conductive patterns, and are not limited to any one embodiment.

Referring to FIG. 6C, according to an embodiment of the inventive concept, a plurality of contact portions CTP3-1 and CTP-3-2 may be positioned in one opening NPXA-OP. In this case, a (3-1)-th contact portion CTP3-1 and a (3-2)-th contact portion CTP3-2 may be electrically insulated. However, the embodiment of the inventive concept is not limited thereto, and the (3-1)-th contact portion CTP3-1 and the (3-2)-th contact portion CTP3-2 may be electrically connected according to design conditions, but are not limited to any one embodiment.

As shown in the drawing, the (3-1)-th contact portion CTP3-1 and the (3-2)-th contact portion CTP3-2, which are positioned in one opening NPXA-OP may be connected to different first and second conductive patterns MTL1 and MLT2 of the conductive layer MTL, and are not limited thereto, and the plurality of contact portions CTP3-1 and CTP3-2 may be connected to the same conductive pattern and are not limited to any one embodiment.

In addition, the extension directions of the first conductive pattern MTL1 and the second conductive pattern MTL2 of the conductive layer MTL according to an embodiment of the inventive concept are not limited to what is shown in the drawing, and the conductive pattern of the conductive layer MTL may extend in various directions as long as the conductive patterns are spaced apart from the first to third light emitting regions PXA-R, PXA-G, and PXA-B when viewed on a plane, and are not limited to one embodiment.

Meanwhile, the shape, area, and arrangement of the first to third light emitting regions PXA-R, PXA-G, and PXA-B of the electronic panel EPL (see FIG. 2) according to an embodiment of the inventive concept and the shape and arrangement of conductive patterns of the conductive layer MTL may be designed in various ways according to the color of emitted light or the size and configuration of the electronic panel EPL, see FIG. 2, and this is not limited to the embodiments shown in FIGS. 6A to 6C.

Figure 7A:
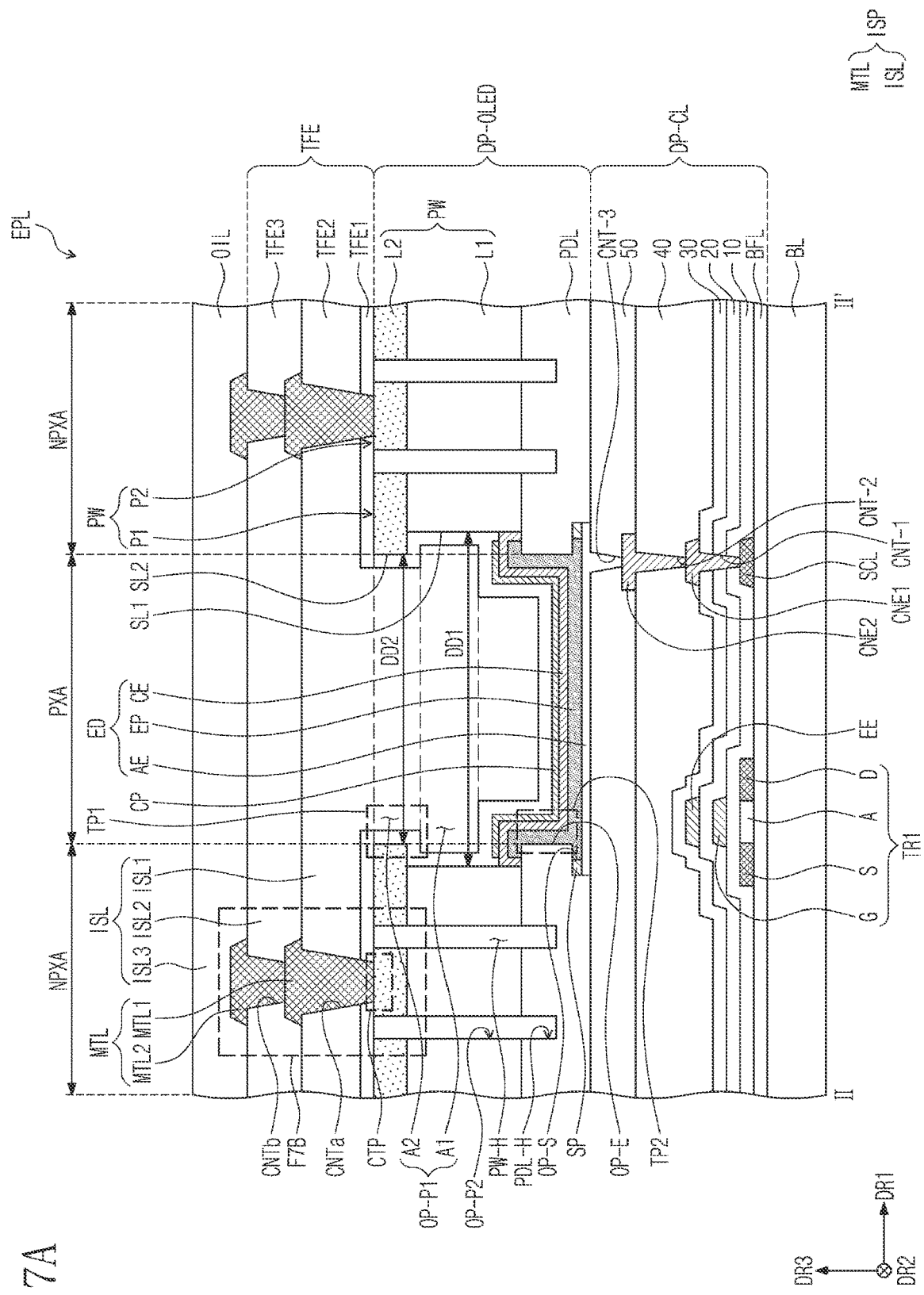
FIGS. 7A, 7B, and 7C are cross-sectional views of a portion of an electronic panel according to an embodiment of the inventive concept.
Figure 7B:
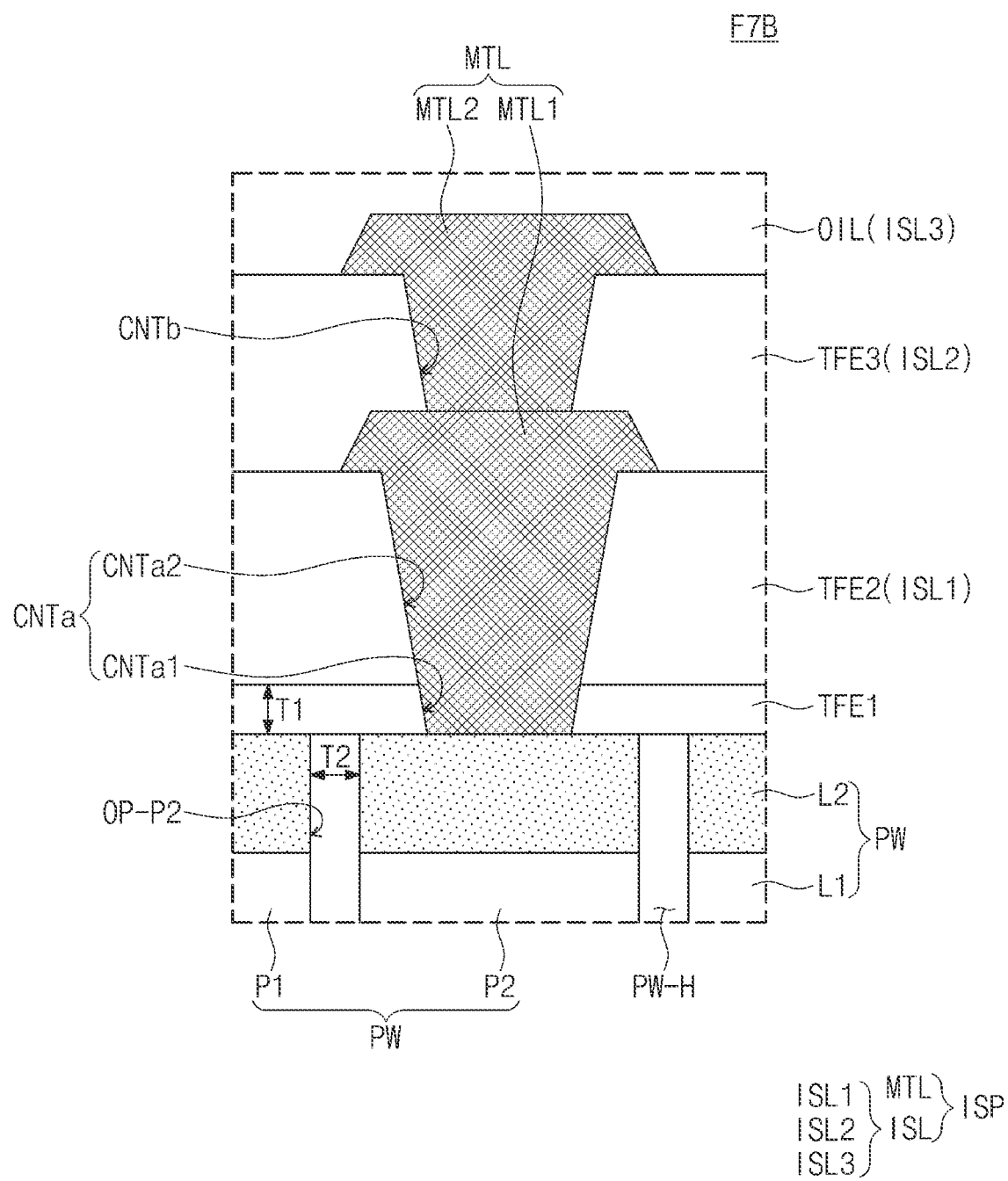
Figure 7C:
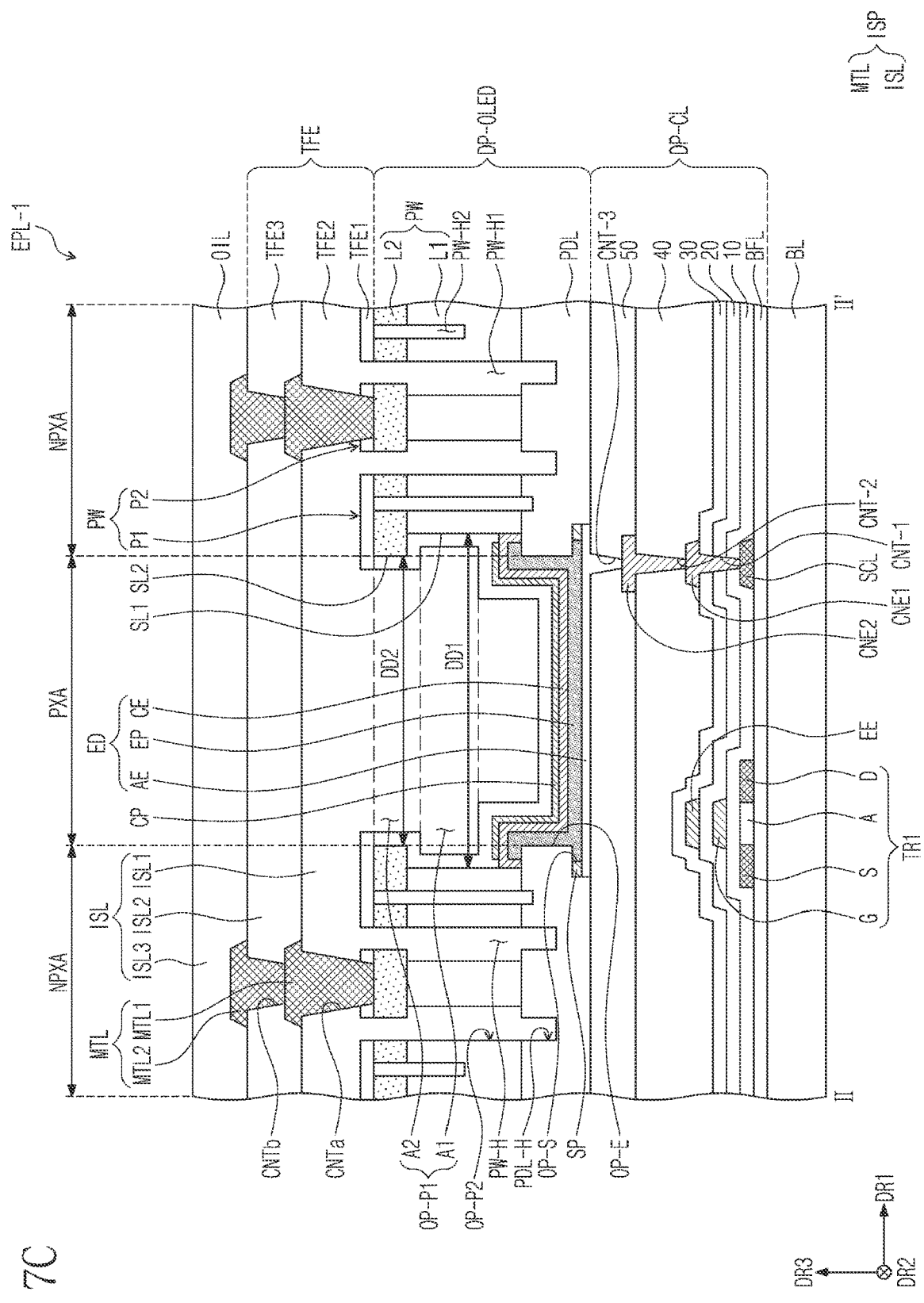

FIGS. 7A to 7C are cross-sectional views of a portion of an electronic panel according to an embodiment of the inventive concept. Specifically, FIG. 7B is an enlarged view of F7B of FIG. 7A, and FIG. 7C is a cross-sectional view of a portion of an electronic panel of another embodiment from FIG. 7A.

FIG. 7A is a view enlarging a portion of a light emitting region (e.g., the first light emitting region PXA-R, see FIG.

6A) among the light emitting regions PXA (see FIG. 6A) in the display region DA (see FIG. 6A). The light emitting region PXA of FIG. 7A is not limited to the first light emitting region PXA-R (see FIG. 6A) of FIG. 6A, and may correspond to any one of the second light emitting region PXA-G (see FIG. 6A) or the third light emitting regions PXA-B (see FIG. 6A) of FIG. 6A. In addition, the embodiment of the inventive concept is not limited thereto, and FIG. 7A may correspond to any one of the light emitting regions shown in FIGS. 6B and 6C, and is not limited to any one embodiment.

Referring to FIG. 7A, the electronic panel EPL may include a base layer BL, a circuit element layer DP-CL, a display element layer DP-OLED, an encapsulation layer TFE, and a sensor portion ISP.

The electronic panel EPL may include a plurality of insulating layers, semiconductor patterns, conductive patterns, and signal lines. An insulating layer, a semiconductor layer, and a conductive layer may be formed through processes such as coating or deposition. Thereafter, the insulating layer, the semiconductor layer, and the conductive layer may be selectively patterned through photolithography and etching. The semiconductor patterns, conductive patterns, signal lines, and the like included in the circuit element layer DP-CL and the display element layer DP-OLED may be formed through such processes described above.

The circuit element layer DP-CL may be disposed on the base layer BL. The circuit element layer DP-CL may include a buffer layer BFL, a transistor TR1, a signal transmission region SCL, first to fifth insulating layers 10, 20, 30, 40, and 50, an electrode EE, and a plurality of connection electrodes CNE1 and CNE2.

The buffer layer BFL may be disposed on the base layer BL. The buffer layer BFL may improve the bonding force between the base layer BL and the semiconductor patterns. The buffer layer BFL may include a silicon oxide layer and a silicon nitride layer. The silicon oxide layer and the silicon nitride layer may be alternately stacked.

The semiconductor patterns may be disposed on the buffer layer BFL. The semiconductor patterns may include polysilicon. However, the embodiment of the inventive concept is not limited thereto, and the semiconductor patterns may include amorphous silicon or a metal oxide. FIG. 7A only shows a portion of the semiconductor patterns, and the semiconductor patterns may be further disposed in the plurality of light emitting regions PXA-R, PXA-G, and PXA-B (see FIG. 5). The semiconductor patterns may be arranged according to specific rules over the plurality of light emitting regions PXA-R, PXA-G, and PXA-B (see FIG. 5). The semiconductor patterns may have different electrical properties according to with/without doping. The semiconductor patterns may include a first region having a high doping concentration and a second region having a low doping concentration. The first region may be doped with an N-type dopant or a P-type dopant. A P-type transistor may include the first region doped with the P-type dopant.

The first region has greater conductivity than the second region, and substantially serves as an electrode or a signal line. The second region may substantially correspond to an active (or a channel) of the transistor. That is, a portion of the semiconductor patterns may be an active of the transistor, another portion may be a source or a drain of the transistor, and the other portion may be a conductive region.

A source S, an active A, and a drain D of the transistor TR1 may be formed from the semiconductor patterns. FIG. 7A shows a portion of the signal transmission region SCL formed from the semiconductor patterns. Although not shown separately, the signal transmission region SCL may be connected to the drain D of the transistor TR1 when viewed on a plane.

The first to fifth insulating layers 10 to 50 may be disposed on the buffer layer BFL. The first to fifth insulating layers 10 to 50 may be inorganic layers or organic layers.

The first insulating layer 10 may be disposed on the buffer layer BFL. A gate G may be disposed on the first insulating layer 10. The second insulating layer 20 may be disposed on the first insulating layer 10 to cover the gate G. The electrode EE may be disposed on the second insulating layer 20. The third insulating layer 30 may be disposed on the second insulating layer 20 to cover the electrode EE.

A first connection electrode CNE1 may be disposed on the third insulating layer 30. The first connection electrode CNE1 may be connected to the signal transmission region SCL through a contact hole CNT-1 that passes through the first to third insulating layers 10 to 30. The fourth insulating layer 40 may be disposed on the third insulating layer 30 to at least partially cover the first connection electrode CNE1. The fourth insulating layer 40 may be an organic layer.

A second connection electrode CNE2 may be disposed on the fourth insulating layer 40. The second connection electrode CNE2 may be connected to the first connection electrode CNE1 through a contact hole CNT-2 that passes through the fourth insulating layer 40. The fifth insulating layer 50 may be disposed on the fourth insulating layer 40 to at least partially cover the second connection electrode CNE2. The fifth insulating layer 50 may be an organic layer.

The display element layer DP-OLED may be disposed on the circuit element layer DP-CL. The display element layer DP-OLED may include a light emitting element ED, a pixel defining film PDL, and a barrier rib PW.

In an embodiment of the inventive concept, the light emitting element ED may include an anode AE (or first electrode), a conductive pattern, a light emitting pattern EP, and a cathode CE (or second electrode). The first to third light emitting elements described above may each have substantially the same components as the light emitting element ED of FIG. 7A. The descriptions of the anode AE, the conductive pattern, the light emitting pattern EP, and the cathode CE may also be applied to all of the anode, the conductive pattern, the light emitting pattern, and the cathode of each of the first to third light emitting elements. The light emitting pattern EP may be referred to as an intermediate layer.

The anode AE may be disposed on the fifth insulating layer 50 of the circuit element layer DP-CL. The anode AE may be a transmissive electrode, a transflective electrode, or a reflective electrode. The anode AE may have conductivity. For example, the anode AE may be formed of various materials as long as the materials such as metal, transparent conductive oxide (TCO), or a conductive polymer material have conductivity. The anode AE may be formed of a single layer or multiple layers. In an embodiment, the anode AE may be formed of three layers each including indium tin oxide (ITO), silver (Ag), and indium tin oxide (ITO).

The anode AE may be connected to the second connection electrode CNE2 through a connection contact hole CNT-3 defined through the fifth insulating layer 50. Accordingly, the anode AE may be electrically connected to the signal transmission region SCL through the first and second connection electrodes CNE1 and CNE2 and electrically connected to a corresponding circuit element.

According to an embodiment of the inventive concept, the electronic panel EPL may further include a sacrificial pattern SP. The sacrificial pattern SP may be disposed on an upper surface of the anode AE. A sacrificial opening OP-S exposing a portion of the upper surface of the anode AE may be defined in the sacrificial pattern SP. The sacrificial pattern SP may include an amorphous transparent conductive oxide.

The pixel defining film PDL may be disposed on the fifth insulating layer 50 of the circuit element layer DP-CL. A light emitting opening OP-E may be defined in the pixel defining film PDL. The light emitting opening OP-E may overlap the anode AE, and the pixel defining film PDL may expose at least a portion of the anode AE through the light emitting opening OP-E.

In addition, the light emitting opening OP-E may correspond to the sacrificial opening OP-S of the sacrificial pattern SP. According to an embodiment of the inventive concept, the upper surface of the anode AE may be spaced apart from the pixel defining film PDL in a cross-section with the sacrificial pattern SP therebetween, and accordingly, the anode AE may be protected from being damaged in a process of forming the light emitting opening OP-E.

A width of the light emitting opening OP-E in one direction may be smaller than a width of the sacrificial opening OP-S in one direction. Herein, one direction may indicate a direction perpendicular to a thickness direction (i.e., perpendicular to the third direction DR3) of the electronic panel EPL. An inner surface of the pixel defining film PDL defining the light emitting opening OP-E may be closer to the center of the anode AE than an inner surface of the sacrificial pattern SP defining the sacrificial opening OP-S. Referring to the drawing, the pixel defining film PDL may have an undercut shape in a cross-section. That is, the pixel defining film PDL may include a tip portion TP2. However, the embodiment of the inventive concept is not limited thereto, and the inner surface of the sacrificial pattern SP defining the sacrificial opening OP-S may be substantially aligned with the inner surface of the pixel defining film PDL defining the corresponding light emitting opening OP-E. In this case, the light emitting region PXA may be regarded as a region of the anode AE exposed through the corresponding sacrificial opening OP-S. Meanwhile, in an embodiment of the inventive concept, the sacrificial pattern SP may be omitted.

The pixel defining film PDL may include an inorganic insulating material. For example, the pixel defining film PDL may include silicon nitride (SiNx). The pixel defining film PDL may be disposed between the anode AE and the barrier rib PW to prevent the anode AE and the barrier rib PW from being electrically connected.

A groove portion PDL-H of the pixel defining film PDL may be defined in the pixel defining film PDL. The groove portion PDL-H of the pixel defining film PDL may be spaced apart from the light emitting opening OP-E when viewed on a plane.

The barrier rib PW may be disposed on the pixel defining film PDL. The barrier rib PW may include a first barrier rib opening OP-P1. The first barrier rib opening OP-P1 may correspond to the light emitting opening OP-E and may extend to at least a portion of the anode AE.

The barrier rib PW may have an undercut shape in a cross-section. The barrier rib PW may include a plurality of layers which are sequentially stacked, and at least one layer of the plurality of layers may be recessed compared to adjacent stacked layers. Accordingly, the barrier rib PW may include a tip portion TP1.

In the present embodiment, the barrier rib PW may include a first barrier rib layer L1 and a second barrier rib layer L2. The first barrier rib layer L1 may be disposed on the pixel defining film PDL, and the second barrier rib layer L2 may be disposed on the first barrier rib layer L1. As shown in FIG. 7A, the first barrier rib layer L1 may have a greater thickness than the second barrier rib layer L2, but the embodiment of the inventive concept is not limited thereto. In the drawing, the barrier rib PW only shows a condition in which the first barrier rib layer L1 and the second barrier rib layer L2 are disposed, but the embodiment of the inventive concept is not limited thereto, and a third barrier rib layer may be disposed on the second barrier rib layer L2, and this is not limited to any one embodiment. In addition, the third barrier rib layer may have a greater thickness than the second barrier rib layer L2, but the embodiment of the inventive concept is not limited thereto.

The first barrier rib layer L1 may have conductivity. The first barrier rib layer L1 may include a conductive material. For example, the conductive material may include metal, metal nitride, transparent conductive oxide (TCO), or a combination thereof. For example, the metal may include gold (Au), silver (Ag), aluminum (Al), magnesium (Mg), lithium (Li), molybdenum (Mo), titanium (Ti), copper (Cu), or an alloy. The metal nitride may include titanium nitride (TiN). The transparent conductive oxide may include indium tin oxide (ITO), indium zinc oxide (IZO), zinc oxide, indium oxide, indium gallium oxide, indium gallium zinc oxide (IGZO), or aluminum zinc oxide.

The second barrier rib layer L2 is disposed on the first barrier rib layer L1. The second barrier rib layer L2 may include a material having a different etching selectivity from that of the first barrier rib layer L1. For example, reactivity of the second barrier rib layer L2 to an etchant used to form an undercut may be lower than reactivity of the first barrier rib layer L1.

In the present embodiment, the first barrier rib layer L1 may be relatively recessed compared to the second barrier rib layer L2 with respect to the light emitting region PXA. That is, the first barrier rib layer L1 may be formed to have an undercut with respect to the second barrier rib layer L2. A portion of the second barrier rib layer L2, which is protruding from the first barrier rib layer L1 toward the light emitting region PXA may define the tip portion TP1 in the barrier rib layer PW.

The second barrier rib layer L2 may include a conductive material. For example, the conductive material may include metal, metal nitride, transparent conductive oxide (TCO), or a combination thereof. For example, the metal may include gold (Au), silver (Ag), aluminum (Al), magnesium (Mg), lithium (Li), molybdenum (Mo), titanium (Ti), copper (Cu), or an alloy. The metal nitride may include titanium nitride (TiN). The transparent conductive oxide may include indium tin oxide (ITO), indium zinc oxide (IZO), zinc oxide, indium oxide, indium gallium oxide, indium gallium zinc oxide (IGZO), or aluminum zinc oxide.

In the present embodiment, the first barrier rib opening OP-P1 may include a first portion A1 and a second portion A2. The first barrier rib layer L1 may include a first inner surface SL1 defining the first portion A1 of the first barrier rib opening OP-P1. The second barrier rib layer L2 may include a second inner surface SL2 defining the second portion A2 of the first barrier rib opening OP-P1.

In a cross-section, a diameter DD2 of the second portion A2 may be smaller than a diameter DD1 of the first portion A1. The second inner surface SL2 may be closer to the center of the anode AE than the first inner surface SL1. That is, the first inner surface SL1 may be disposed to be recessed in a direction farther from the center of the anode AE than the second inner surface SL2. Accordingly, the second barrier rib layer L2 may include a lower surface exposed from the first barrier rib layer L1.

The barrier rib PW may have an undercut shape in a cross-section. As described above, the undercut shape of the barrier rib PW may be defined by a step between the first inner surface SL1 of the first barrier rib layer L1 and the second inner surface SL2 of the second barrier rib layer L2. Meanwhile, the shape of the barrier rib PW in a cross-section is not limited thereto, and when the diameter DD2 of the second region A2 is greater than the diameter DD1 of the first region A1, the barrier rib PW may have various shapes, such as a reverse taper shape, an overhang, and the like, the shape is not limited to any one embodiment.

FIG. 7A shows that each of the first and second inner surfaces SL1 and SL2 is perpendicular to an upper surface of the fifth insulating layer 50, but the embodiment of the inventive concept is not limited thereto.

The light emitting pattern EP may be disposed on the anode AE. The light emitting pattern EP may be patterned by the tip portion TP1 defined in the barrier rib PW. At least a portion of the light emitting pattern EP may be disposed in the light emitting opening OP-E. The light emitting patterns EP may be entirely disposed in the light emitting opening OP-E, and the light emitting patterns EP may be disposed in the light emitting opening OP-E as well as in the first barrier rib opening OP-P1. In an embodiment including the sacrificial pattern SP, the light emitting pattern EP may also be disposed in the sacrificial opening OP-S.

The light emitting pattern EP may include an emission layer including a light emitting material. The light emitting pattern EP may further include a hole injection layer (HIL) and a hole transport layer (HTL) disposed between the anode AE and the emission layer, and may further include an electron transport layer (ETL) and an electron injection layer (EIL) disposed on the emission layer. The light emitting pattern EP may also be referred to as an 'organic layer' or an 'intermediate layer'.

The cathode CE may be disposed on the light emitting pattern EP. The cathode CE may be patterned by the tip portion TP1 defined in the barrier rib PW. At least a portion of the cathode CE may be disposed in the first barrier rib opening OP-P1. In an embodiment of the inventive concept, a portion of the cathode CE may also be disposed in the light emitting opening OP-E according to the thickness of the light emitting pattern EP or the thickness of the pixel defining film PDL.

The cathode CE may have conductivity. For example, the cathode CE may be formed of various materials as long as the materials such as metal, transparent conductive oxide (TCO), or a conductive polymer material have conductivity.

According to an embodiment of the inventive concept, the electronic panel EPL may further include a capping pattern CP. The capping pattern CP may be disposed on the cathode CE. The capping pattern CP may be patterned by the tip portion TP1 defined in the barrier rib PW. At least a portion of the capping pattern CP may be disposed in the first barrier rib opening OP-P1. Although FIG. 7A shows that the capping pattern CP is disposed in the first barrier rib opening OP-P1 and the light emitting opening OP-E as an example, but the embodiment of the inventive concept is not limited thereto, and the capping pattern CP may be disposed only in the first barrier rib opening OP-P1 according to the thickness of the light emitting pattern EP or the thickness of the pixel defining film PDL.

The encapsulation layer TFE may be disposed on the display element layer DP-OLED. The encapsulation layer TFE may include a first encapsulation layer TFE1, a second encapsulation layer TFE2, and a third encapsulation layer TFE3.

The first encapsulation layer TFE1 may cover the light emitting element ED. Specifically, the first encapsulation layer TFE1 may cover the cathode CE, and in an embodiment, may also cover the capping pattern CP disposed on the cathode CE. For example, the first encapsulation layer TFE1 may include an inorganic material.

A portion of the first encapsulation layer TFE1 may be disposed in the light emitting opening OP-E and the first barrier rib opening OP-P1. The second encapsulation layer TFE2 may cover the first encapsulation layer TFE1 and provide a flat upper surface. The third encapsulation layer TFE3 may be disposed on the second encapsulation layer TFE2. For example, the second encapsulation layer TFE2 may include an organic material, and the third encapsulation layer TFE3 may include an inorganic material.

The first encapsulation layer TFE1 and the third encapsulation layer TFE3 may protect the display element layer DP-OLED against moisture/oxygen, and the second encapsulation layer TFE2 may protect the display element layer DP-OLED against foreign substances.

The sensor portion ISP may be disposed on the first encapsulation layer TFE1. In the present embodiment, the sensor portion ISP may be disposed on each of the encapsulation layers TFE through a roll-to-roll process.

The sensor portion ISP may include a first insulating layer ISL1, a first conductive layer MTL1, a second insulating layer ISL2, a second conductive layer MTL2, and a third insulating layer ISL3. The first conductive layer MTL1 may be disposed on the first insulating layer ISL1, the second insulating layer ISL2 may be disposed on the first conductive layer MTL1, the second conductive layer MTL2 may be disposed on the second insulating layer iSL2, and the third insulating layer ISL3 may be disposed on the second conductive layer MTL2.

Referring to the drawing, the first conductive layer MTL1 may be disposed on the first insulating layer ISL1. In addition, the first conductive layer MTL1 may be disposed in a hole CNTa formed in the first insulating layer ISL1. The second conductive layer MTL2 may be disposed on the second insulating layer ISL2 and may be connected to the first conductive layer MTL1 through a hole CNTb formed in the second insulating layer ISL2.

The first insulating layer ISL1 may be an inorganic layer including at least one of silicon nitride, silicon oxynitride, or silicon oxide. The first insulating layer ISL2 may include an epoxy resin, an acrylic resin, or an imide-based resin, but is not limited thereto. The first insulating layer ISL1 may have a single-layer structure or a structure of multiple layers stacked along the third direction.

Each of the first conductive layer MTL1 and the second conductive layer MTL2 may include sensor electrodes TE (see FIG. 5). For example, the first sensor patterns SP1 (see FIG. 5), the first connection patterns BP1 (see FIG. 5), and the second sensor patterns SP2 (see FIG. 5) may be included in the second conductive layer MTL2, and the second connection patterns BP2 (see FIG. 5) may be included in the first conductive layer MTL1. However, the embodiment of the inventive concept is not limited thereto, and the first sensor patterns SP1 (see FIG. 5), the first connection patterns BP1 (see FIG. 5), and the second sensor patterns SP2 (see FIG. 5) may be included in the first conductive layer MTL1, and the second connection patterns BP2 (see FIG. 5) may be included in the second sensor conductive layer MTL2. Alternatively, in an embodiment, the first sensor patterns SP1 (see FIG. 5), the second sensor patterns SP2 (see FIG. 5), and the second connection patterns BP2 (see FIG. 5) may be disposed on the same layer, and the first connection patterns BP1 (see FIG. 5) may be disposed on a different layer from the first sensor patterns SP1 (see FIG. 5). Alternatively, any one of the first sensor electrode TE1 and the second sensor electrode TE2 may constitute the first conductive layer MTL1 and the other may constitute the second conductive layer MTL2. Alternatively, the sensor electrodes TE1 and TE2 according to an embodiment of the inventive concept may be designed in various structures as long as the sensor electrodes TE1 and TE2 are not electrically shorted to each other, and are not limited to any one embodiment.

The first conductive layer MTL1 and the second conductive layer MTL2 each may have a single-layered structure or may have a multi-layered structure stacked along the third direction DR3.

The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). In addition, the transparent conductive layer may include a conductive polymer such as PEDOT, a metal nanowire, graphene, and the like.

The conductive layer having a multi-layered structure may include metal layers. The metal layers may have a three-layer structure of, for example, titanium/aluminum/titanium. The multi-layered conductive layer may include at least one metal layer and at least one transparent conductive layer.

At least any one of the second insulating layer ISL2 or the third insulating layer ISL3 may include an inorganic film. The inorganic film may include at least one of aluminum oxide, titanium oxide, silicon oxide, silicon nitride, silicon oxynitride, zirconium oxide, or hafnium oxide.

At least any one of the second insulating layer ISL2 or the third insulating layer ISL3 may include an organic film. The organic film may include at least any one of an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

According to an embodiment of the inventive concept, the first insulating layer ISL1 may be a second encapsulation layer TFE2, and the second insulating layer ISL2 may be a third encapsulation layer TFE3.

The first insulating layer ISL1 and the second insulating layer ISL2 constituting the sensor portion ISP are provided as the second encapsulation layer TFE2 and the third encapsulation layer TFE3, so that the electronic panel EPL may have a smaller thickness. In addition, the number of processes for forming a plurality of layers may be reduced and simplified to obtain benefits in terms of productivity, production costs, and production time.

Referring to FIGS. 7A and 7B, the barrier rib PW may include a first portion P1 and a second portion P2 that are insulated from each other. The first portion P1 may define a first barrier rib opening OP-P1 and a second barrier rib opening OP-P2. When viewed on a plan view, the first barrier rib opening OP-P1 may be a portion overlapping the light emitting opening OP-E, and the second barrier rib opening OP-P2 may be a portion spaced apart from the light emitting opening OP-E. When viewed on a plane, the first barrier rib opening OP-P1 may be spaced apart from the groove portion PDL-H of the pixel defining film PDL, and the second barrier rib opening OP-P2 may overlap the groove portion PDL-H of the pixel defining film. When the first portion P1 and the second portion P2 are made to be space apart, signals transmitted to the cathode CE electrically connected to the first portion P1 and signals transmitted to the sensor portion ISP electrically connected to the second portion P2 may be prevented from interfering with each other.

The second portion P2 may overlap the second barrier rib opening OP-P2 when viewed on a plane. For example, the first portion P1 and the second portion P2 may be spaced apart when viewed on a plane.

The first conductive layer MTL1 of the sensor portion ISP may be electrically connected to the second portion P2 of the barrier rib PW. A portion CTP in which the first conductive layer MTL1 and the second portion P are electrically connected may correspond to the contact portion CTP (see FIG. 6A) of FIGS. 6A to 6C described above. The first conductive layer MTL1 may be disposed on the second portion P2 and may overlap the second portion P2 when viewed on a plane.

Referring to FIG. 6B, the first conductive layer MTL1 may be electrically connected to the second portion P2 through a (1-1)-th contact hole CNTa1 defined in the first encapsulation layer TFE1 and a (1-2)-th contact hole CNTa2 defined in the second encapsulation layer TFE. The second conductive layer MTL2 may be electrically connected to the first conductive layer MTL1 through the second contact hole CNTb defined in the third encapsulation layer TFE3. In the drawing, only portions of the first to third encapsulation layers TFE1, TFE2, and TFE3 in which the first contact hole CNTa and the second contact hole CNTb are defined are shown, and contact holes may not be defined in portions of the first to third encapsulation layers TFE1, TF2, and TFE3, which are not shown in the drawing.

Resistance of the first conductive layer MTL1 and the sensor portion ISP may be reduced by electrically connecting the second portion P2 and the first conductive layer MTL1 each having conductivity. Accordingly, RC delay may be reduced. Typically, for example, in order to reduce RC delay, the first conductive layer MTL1 or the second conductive layer MTL2 was made to have a greater thickness. In the present embodiment, the resistance of the sensor portion ISP may be reduced through the second portion P2 having conductivity, as in the case of increasing the thickness of the first conductive layer MTL1, and accordingly, the RC delay may be reduced. In addition, the RC delay may be reduced without increasing the thicknesses of the first conductive layer MTL1 and the second conductive layer MTL2, and effects resulting from the RC delay reduction may be further maximized by reducing the thickness of the first conductive layer MTL1 or the second conductive layer MTL2. According to an embodiment of the inventive concept, the thickness of patterns of the first conductive layer MTL1 electrically connected to the second portion P2 may be provided to be smaller than the thickness of patterns of the second conductive layer MTL2. This may also be applied to a width of each pattern.

For example, when the thickness of the first conductive layer MTL1 and the second conductive layer MTL2 is provided to be 6000 Å (Amstrong) or less, the patterns of the conductive layers, which may be viewed due to internal and external light, may be prevented from being viewed.

The first conductive layer MTL1 may be spaced apart from the second barrier rib opening OP-P2. In a cross-section, the first conductive layer MTL1 and the second barrier rib opening OP-P2 may not overlap.

A distance T2 between the first portion P1 and the second portion P2 may be smaller than a thickness T1 of the first encapsulation layer TFE1. Preferably, when a minimum thickness T1 of the first encapsulation layer TFEL is 1.0 um (micrometer) to 1.5 um (micrometer), a distance T2 between the first portion P1 and the second portion P2 is 1.0 um. (micrometer) or less, upon applying the first encapsulation layer TFE1 onto the barrier rib PW, the first encapsulation layer TFE1 may not be accommodated in the groove space between the first portion and the second portion. In this case, the groove space PW-H may correspond to all or a portion of the second barrier rib opening OP-P2.

For example, when a distance T2 between the first portion P1 and the second portion P2 is smaller than a specific value and smaller than a thickness of the first encapsulation layer TFE1, upon applying the first encapsulation layer TFE1 onto the barrier rib PW, the first encapsulation layer TFE1 may not be accommodated in the groove space PW-H of the barrier rib PW. Preferably, when a minimum thickness T1 of the first encapsulation layer TFEL is 1.0 um (micrometer) to 1.5 um (micrometer), a distance T2 between the first portion P1 and the second portion P2 is 1.0 um. (micrometer) or less, upon applying the first encapsulation layer TFE1 onto the barrier rib PW, the first encapsulation layer TFE1 may not be accommodated in the groove space PW-H between the first portion P1 and the second portion P2.

In this case, an air layer may be formed in the groove space PW-H between the first portion P1 and the second portion P2. Air is a material having a low permittivity and may effectively prevent current flow between the first portion P1 and the second portion P2, which is caused by tunneling or other phenomena between the insulated first portion P1 and the second portion P2.

The embodiment of the inventive concept is not limited thereto, and a material having a low permittivity other than air may be accommodated in the groove space PW-H between the first portion P1 and the second portion P2, and this is not limited to any one embodiment.

Referring to FIG. 7C, in groove spaces PW-H1 and PW-H2 between the first portion P1 and the second portion P2 of an electronic panel EPL-1 according to an embodiment of the inventive concept, materials other than air may be accommodated. For example, at least one of an inorganic material or an organic material may be disposed between the first portion P1 and the second portion P2. In this case, a material disposed between the first portion P1 and the second portion P2 may be a material having a low permittivity.

Unlike what is described above, when the distance T2 (see FIG. 7B) between the first portion P1 and the second portion P2 is provided to be greater than the thickness T1 (see FIG. 7B) of the first encapsulation layer TFE1, or when the distance T1 (see FIG. 7B) between the first portion P1 and the second portion P2 is greater than or equal to a predetermined interval, a portion of the first encapsulation layer TFE1 or the second encapsulation layer TFE2 may be accommodated. Alternatively, a material other than the first encapsulation layer TFE1 or the second encapsulation layer TFE2 may be accommodated between the first portion P1 and the second portion P2.

For example, the material of the first encapsulation layer TFE1 may be accommodated in a groove portion PDL-H of the pixel defining film PDL, and a material accommodated in the second barrier rib opening OP-P2 may be the material of the first encapsulation layer TFE1. The material of the first encapsulation layer TFE1 and the material of the second encapsulation layer TFE2 may be accommodated in the groove portion PDL-H of the pixel defining film PDL, and the material of the second encapsulation layer TFE2 may be accommodated in the second barrier rib opening OP-P2, and this is not limited to any one embodiment.

A plurality of sub-grooves PW-H2 may be defined in the display element layer DP-OLED of the electronic panel EPL according to an embodiment of the inventive concept. A space accommodating air or a material having a permittivity may be defined in each of the plurality of sub grooves PW-H2. The sub-groove PW-H2 may be defined in the first portion P1 of the barrier rib PW, but is not limited thereto and may also be defined in the pixel defining film PDL. However, the embodiment of the inventive concept is not limited thereto, and the sub-groove PW-H2 may be defined in the second portion P2 of the barrier rib PW, and is not limited to any one embodiment.

A thickness of the sub-groove PW-H2 may be equal to the distance between the first portion P1 and the second portion P2. However, the embodiment of the inventive concept is not limited thereto, and the thickness of the sub-groove PW-H2 may be different from the distance between the first portion P1 and the second portion P2, and is not limited to any one embodiment.

The sub groove PW-H2 may be provided in plurality. The sub grooves PW-H2 may be spaced apart. The sub-grooves PW-H2 may be defined between the first barrier rib opening OP-P1 and the second barrier rib opening OP-P2. The sub-grooves PW-H2 are provided between the first barrier rib opening OP-P1 and the second barrier rib opening OP-P2 so that the electrical connection between the first portion P1 and the second portion P2 of a barrier rib may be prevented.

In the drawing, only some of the sub-grooves PW-H2 extend in the second direction and are defined in the first barrier rib layer L1 and the second barrier rib layer L2 of the barrier rib PW, and the pixel defining film PDL, but the embodiment of the inventive concept is not limited thereto, and the sub-grooves PW-H2 may all be defined the first barrier rib layer L1 and the second barrier rib layer L2 of the barrier rib PW, and the pixel defining film PDL, and are limited to any one embodiment.

In the process of forming an undercut shape on the barrier rib PW, which will be described later, in the first portion P1 or the second portion P2, an undercut shape may be formed at a portion overlapping the second barrier rob opening OP-P2. As shown in the drawing, an undercut shape may be formed at a portion of the second portion P2, which faces the first portion P1. Even when a portion of the first barrier rib layer L1 of the second portion P2 is removed to form an undercut shape, the second barrier rib layer L2 of the second portion P2 and the second barrier rib layer L2 of the first portion P1 may have a predetermined distance.

Although the drawing shows that the undercut shape is formed on the second portion P2, but the embodiment of the inventive concept is not limited thereto, and the undercut shape may be formed on a surface of the first portion P1 opposite to a surface on which the tip portion TP1 is formed, and the undercut shape may be formed on surfaces facing each other in the second portion P2 and the first portion P1, and is not limited to any one embodiment.

Figure 8A:
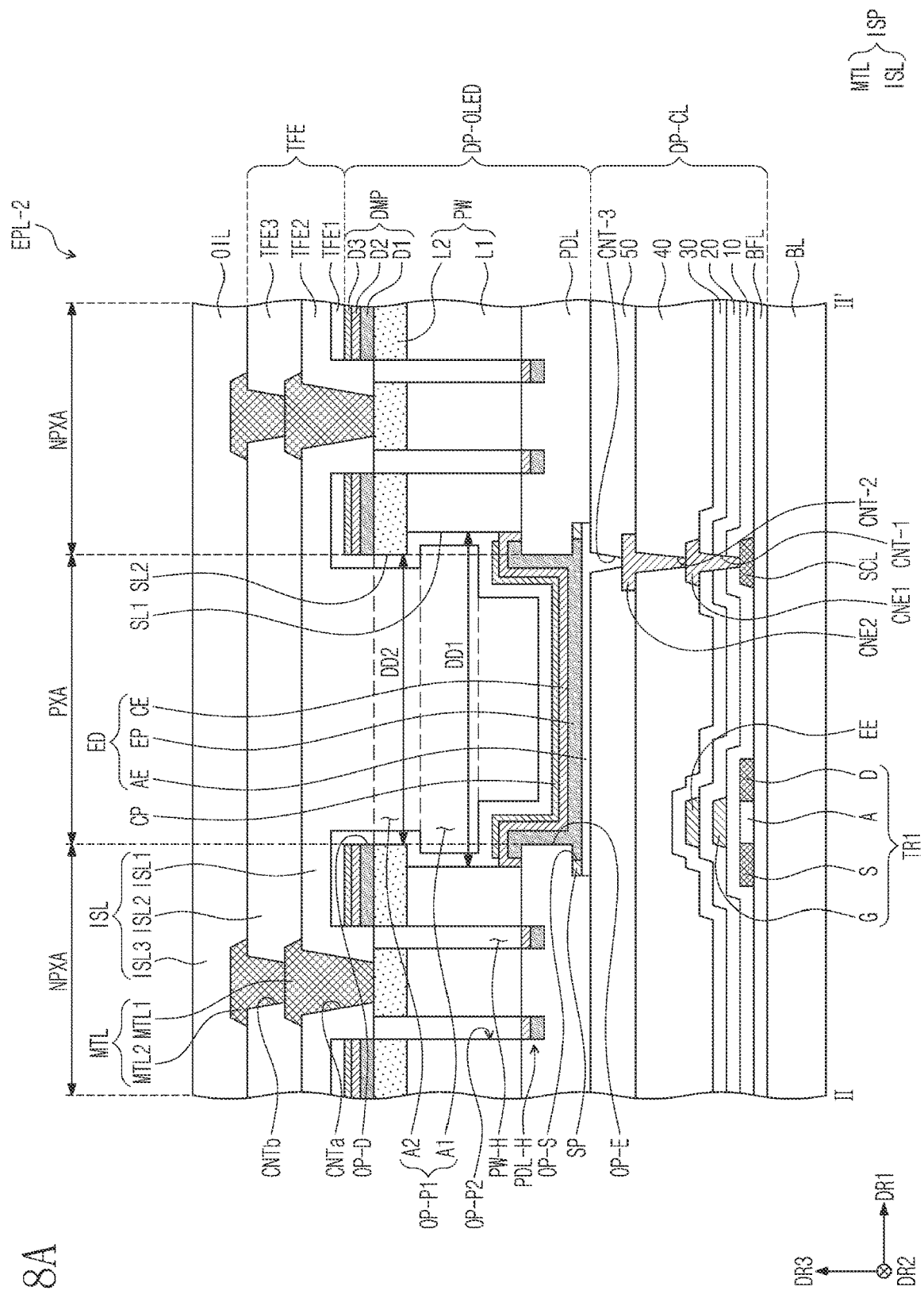
FIGS. 8A and 8B are cross-sectional views of a portion of an electronic device according to an embodiment of the inventive concept.
Figure 8B:
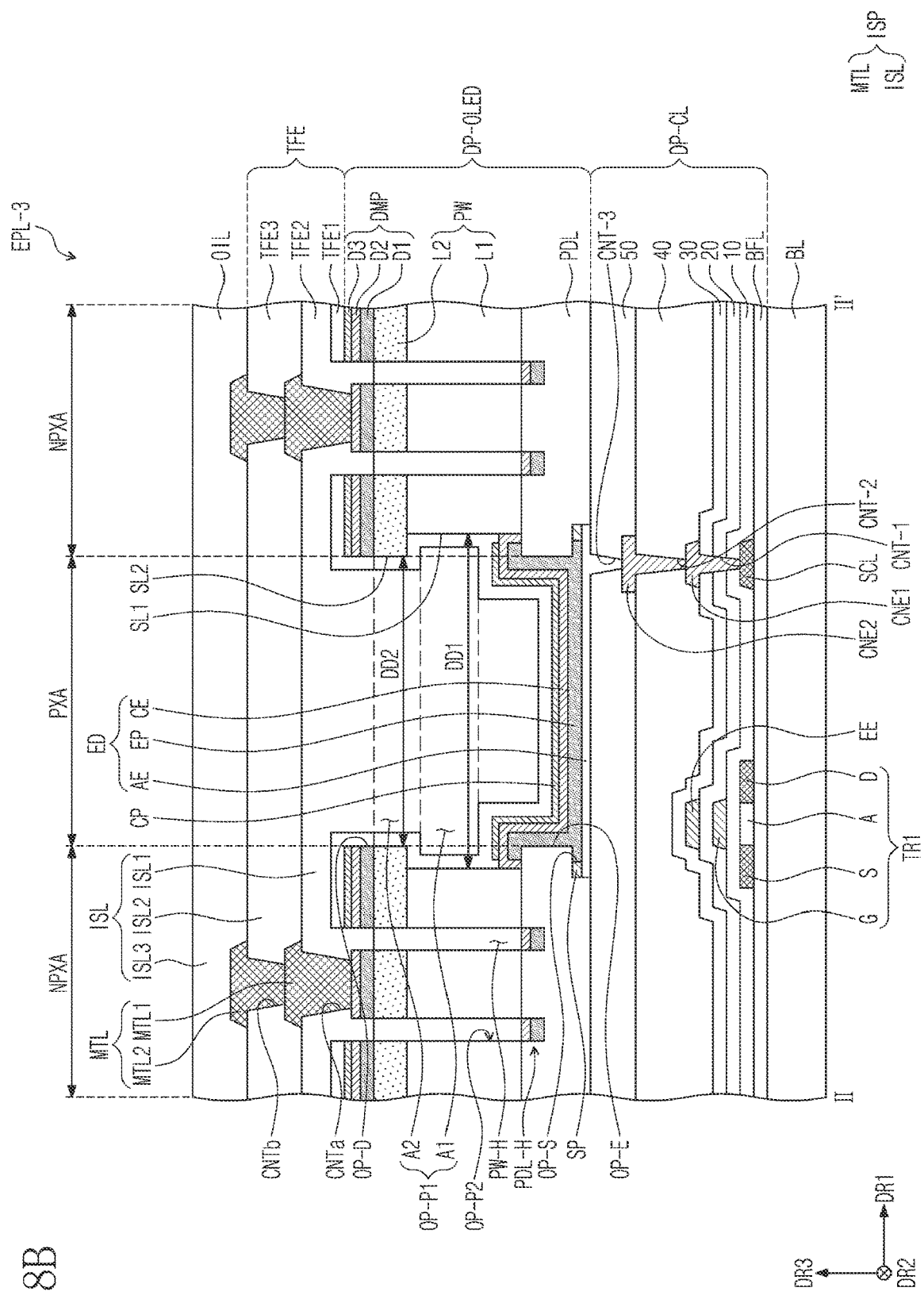

FIGS. 8A and 8B are cross-sectional views of a portion of an electronic device according to an embodiment of the inventive concept. Specifically, FIGS. 8A and 8B are cross-sectional views of a portion of an electronic device of a different embodiment from FIGS. 7A and 7B.

Referring to FIG. 8A, an electronic panel EPL-2 according to an embodiment of the inventive concept may include a dummy pattern DMP. Specifically, the display element layer DP-OLED may include the dummy pattern DMP.

The dummy pattern DMP may be disposed on the barrier rib PW. The dummy pattern DMP may include a first dummy pattern D1, a second dummy pattern D2, and a third dummy pattern D3. The first to third dummy patterns D1, D2, and D3 may be sequentially stacked along the third direction DR3.

The first dummy pattern D1 may include an organic material. For example, the first dummy pattern D1 may include the same material as the light emitting pattern EP. The first dummy pattern D1 may be formed together with the light emitting pattern EP through a single process, and separated from the light emitting pattern EP by the undercut shape of the barrier rib PW.

The second dummy pattern D2 may include a conductive material. For example, the second dummy pattern D2 may include the same material as the cathode CE. The second dummy pattern D2 may be formed together with the cathode CE through a single process and separated from the cathode CE by the undercut shape of the barrier rib PW.

The third dummy pattern D3 may include the same material as the capping pattern CP. The third dummy pattern D3 may be formed together with the capping pattern CP through a single process, and separated from the capping pattern CP by the undercut shape of the barrier rib PW.

A dummy opening OP-D corresponding to the light emitting opening OP-E may be defined in the dummy pattern DMP. The dummy opening OP-D may be defined by inner surfaces of the first to third dummy patterns D1, D2, and D3. When viewed on a plane, the dummy pattern DMP may have a closed-line shape extending along an outer border of the light emitting region PXA.

FIG. 8A shows that the inner surfaces of the first to third dummy patterns D1, D2, and D3 defining the dummy opening OP-D are aligned with a second inner surface SL2 as an example, but the embodiment of the inventive concept is not limited thereto, and the first to third dummy patterns D1, D2, and D3 may cover the second inner surface SL2.

The dummy pattern DMP may be disposed on the first portion P1 of the barrier rib PW. The dummy pattern DMP may not overlap the second portion P2 of the barrier rib PW when viewed on a plane.

As shown in the drawing, a portion of the dummy pattern DMP may overlap the second barrier rib opening OP-P2 of the barrier rib PW when viewed on a plane. A portion of the dummy pattern DMP overlapping the second barrier rib opening OP-P2 when viewed on a plane may be accommodated in the hole PDL-H of the pixel defining film PDL. In a cross-section, the dummy pattern DMP accommodated in the hole PDL-H of the pixel defining film PDL may not overlap the barrier rib PW. In a cross-section, the dummy pattern DMP accommodated in the hole PDL-H of the pixel defining film PDL does not overlap the barrier rib PW and may thus keep a state of insulation between the first portion P1 and the second portion P2 of the barrier rib PW.

However, the embodiment of the inventive concept is not limited to what is shown in the drawing, and a portion of the dummy pattern DMP may not overlap the second barrier rib opening OP-P2, and is not limited to any one embodiment.

The first encapsulation layer TFE1 may overlap the dummy pattern DMP when viewed on a plane. As shown in the drawing, a portion of the first encapsulation layer TFE1 may be disposed on the dummy pattern DMP disposed on the first portion P1 of the barrier rib PW. Specifically, the first encapsulation layer TFE1 may contact an upper surface of the dummy pattern DMP and inner surfaces of the dummy pattern DMP defining the dummy opening OP-D.

However, the embodiment of the inventive concept is not limited to what is shown in the drawing, and a portion of the first encapsulation layer TFE1 may be disposed on the dummy pattern DMP overlapping the second barrier rib opening OP-P2 when viewed on a plane, and is not limited to any one embodiment.

However, the embodiment of the inventive concept is not limited to what is shown in the drawing, and some or all of the dummy patterns DMP may be omitted. For example, some or all of the dummy patterns DMP may be removed prior to forming the first encapsulation layer TFE1 or prior to forming the second encapsulation layer TFE2, but the embodiment of the inventive concept is not limited thereto.

Referring to FIG. 8B, in an electronic device according to an embodiment of the inventive concept, some of the dummy patterns DMP may be disposed on the second portion P2 of the barrier rib PW. In detail, a portion of the first dummy pattern D1 and a portion of the second dummy pattern D2 may be disposed on the second portion P2 of the barrier rib PW.

The first conductive layer MTL1 of the input sensor portion ISP may be disposed on some of the dummy patterns DMP. Referring to the drawing, the first conductive layer MTL1 may be disposed on the second dummy pattern D2. Each of the first dummy pattern D1 and the second dummy pattern D2 may include a conductive material, and accordingly, the first conductive layer MTL1 may be electrically connected to the second portion P2.

However, the embodiment of the inventive concept is not limited thereto, and only the first dummy pattern D1 may be disposed on the second portion P2 and the first conductive layer MTL1 may be disposed on the first dummy pattern D1, and this is not limited to any one embodiment.

Figure 9:
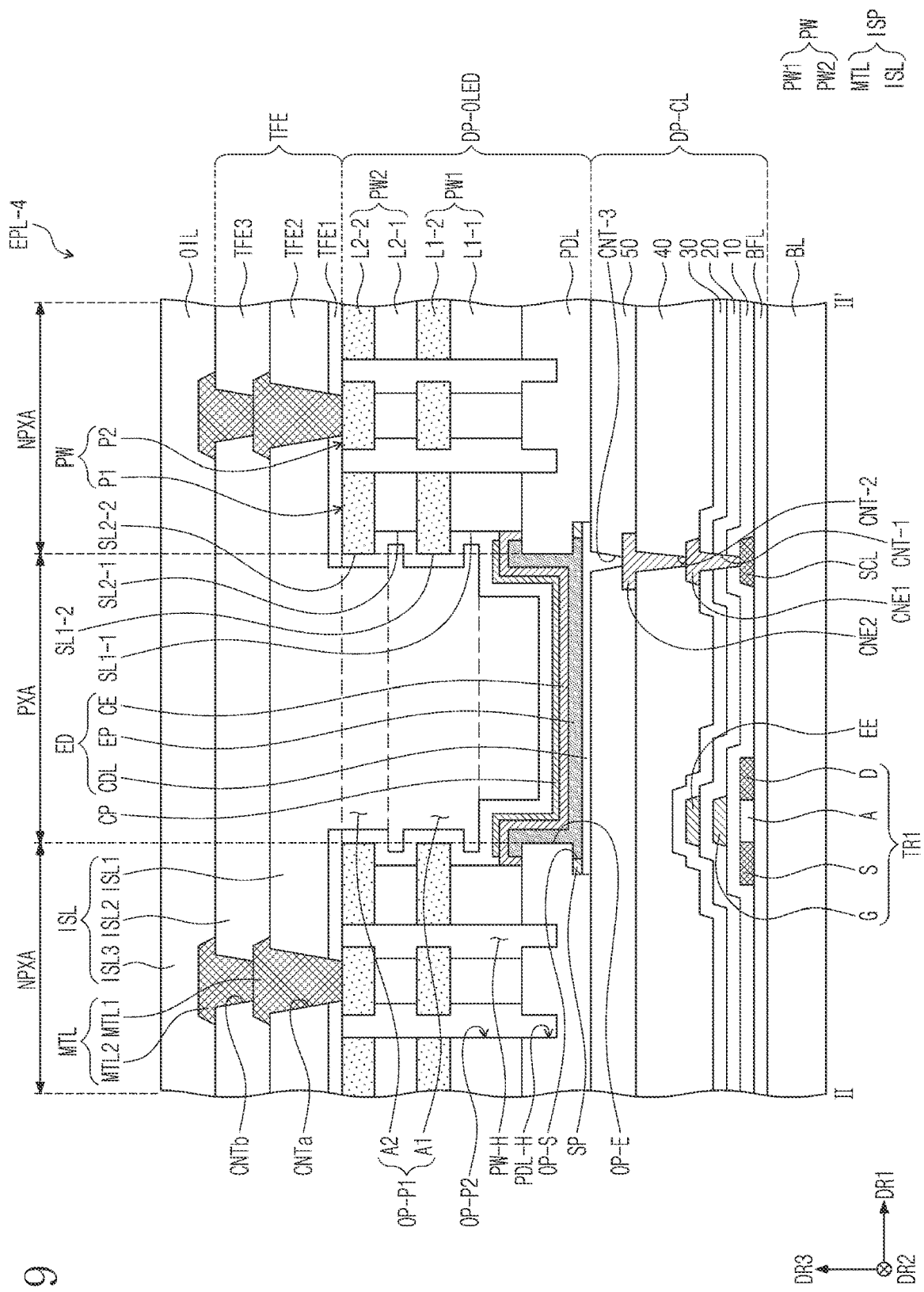
FIG. 9 is a cross-sectional view showing a portion of an electronic device according to an embodiment of the inventive concept.

FIG. 9 is a cross-sectional view of a portion of an electronic device according to an embodiment of the inventive concept. Specifically, FIG. 9 is a cross-sectional view of a portion of an electronic device of a different embodiment from FIG. 7A.

Referring to FIG. 9, the barrier rib PW of an electronic panel EPL-4 according to an embodiment of the inventive concept may include a first barrier rib PW1 and a second barrier rib PW2.

The first barrier rib PW1 may be disposed on the pixel defining film PDL. The first barrier rib PW1 may have an undercut shape in a cross-section. The first barrier rib PW1 may include a plurality of layers sequentially stacked, and at least one layer of the plurality of layers may be recessed compared to adjacent stacked layers. Accordingly, the first barrier rib PW1 may include a tip portion.

In the present embodiment, the first barrier rib PW1 may include a first lower layer L1-1 and a first upper layer L1-2. The first lower layer L1-1 and the first upper layer L1-2 may have conductivity, the first lower layer L1-1 may have a greater thickness than the first upper layer L1-2, and this is not limited to any one embodiment.

The undercut shape of the first barrier rib PW1 may be defined by a step between an inner surface of the first lower layer L1-1 and an inner surface of the first upper layer L1-2.

The first lower layer L1-1 may include metal. For example, at least one of aluminum (Al) or molybdenum (Mo) may be included. However, the material of the first lower layer L1-1 is not limited thereto.

The first upper layer L1-2 may include at least one of metal or metal nitride. For example, the first upper layer L1-2 may include at least one of tungsten (W), molybdenum (Mo), titanium nitride (TiNx), or aluminum nitride (AlNx). In this case, the first upper layer L1-2 may have a greater modulus value than the case in which titanium (Ti) is included, and accordingly, bending of a first tip portion defined in the first upper layer L1-2 may be reduced or prevented. However, the material of the first upper layer L1-2 is not limited thereto.

The second barrier rib PW2 may be disposed on the first barrier rib PW1. The second barrier rib PW2 may have an undercut shape in a cross-section. The second barrier rib PW2 may include a plurality of layers sequentially stacked, and at least one layer of the plurality of layers may be recessed compared to adjacent stacked layers. Accordingly, the second barrier rib PW2 may include a tip portion.

In the present embodiment, the second barrier rib PW2 may include a second lower layer L2-1 and a second upper layer L2-2. The second lower layer L2-1 and the second upper layer L2-2 may have conductivity, the second lower layer L2-1 may have a greater thickness than the second upper layer L2-2, and this is not limited to any one embodiment. In addition, the second lower layer L2-1 may have a smaller thickness than the first lower layer L1-1, and this is not limited to any one embodiment.

The undercut shape of the second barrier rib PW2 may be defined by a step between an inner surface of the second lower layer L2-1 and an inner surface of the second upper layer L2-2.

The second lower layer L2-1 may include metal. For example, at least one of aluminum (Al) or molybdenum (Mo) may be included. However, the material of the second lower layer L2-1 is not limited thereto, and may include an inorganic material. The second lower layer L2-1 may include a different material from the first lower layer L1-1, but the embodiment of the inventive concept is not limited thereto, and the second lower layer L2-1 may include the same material as the first lower layer L1-1.

The second upper layer L2-2 may include at least one of metal or metal nitride. For example, the second upper layer L2-2 may include at least one of tungsten (W), molybdenum (Mo), titanium nitride (TiNx), or aluminum nitride (AlNx). In this case, the second upper layer L2-2 may have a greater modulus value than the case in which titanium (Ti) is included, and accordingly, bending of a second tip portion defined in the second upper layer L2-2 may be reduced or prevented. However, the material of the second upper layer L2-2 is not limited thereto. The second upper layer L2-2 may include the same material as or a different material from the first upper layer L1-2, but the embodiment of the inventive concept is not limited thereto.

Each of the first barrier rib PW1 and the second barrier rib PW2 is made to have an undercut shape to increase a moisture permeation path. In addition, some layers of the second barrier rib PW2 are made to contain an inorganic material to provide high interfacial adhesion with an encapsulation layer. Accordingly, moisture permeation caused by lifting of the encapsulation layer during processes may be prevented, and a moisture permeable path to a light emitting element may be prevented from being formed. Therefore, process reliability may be improved and defects may be reduced.

A first barrier rib opening OP-P1 and a second barrier rib opening OP-P2 may be defined in the first lower layer L1-1, the first upper layer L1-2, the second lower layer L2-1, and the second upper layer L2-2. That is, the first barrier rib opening OP-P1 and the second barrier rib opening OP-P2 may be defined in both the first barrier rib PW1 and the second barrier rib PW2. In addition, grooves of the pixel defining film may be defined in the pixel defining film.

The first barrier rib PW1 may include a (1-1)th inner surface SL1-1 and a (1-2)th inner surface SL1-2. The second barrier rib PW2 may include a (2-1)th inner surface SL2-1 and a (2-2)th inner surface SL2-2.

In the process of forming an undercut shape on the barrier rib PW, which will be described later, in the first portion P1 or the second portion P2, an undercut shape may be formed at a portion overlapping the second barrier rob opening OP-P2. As shown in the drawing, among the portions of the second portion P2, which face the first portion P1, the first lower layer L1-1 and the second lower layer L2-1 are partially removed to form an undercut shape in the second portion P2. Even when the first lower layer L1-1 and the second lower layer L2-1 are partially removed to form an undercut shape, the second upper layer L2-2 of the second portion P2 and the second barrier rib layer L2-2 of the first portion P1 may have a predetermined distance.

Although the drawing shows that the undercut shape is formed on the second portion P2, but the embodiment of the inventive concept is not limited thereto, and the undercut shape may be formed on a surface of the first portion P1 opposite to a surface on which the tip portion TP1 is formed, and the undercut shape may be formed on surfaces facing each other in the second portion P2 and the first portion P1, and is not limited to any one embodiment.

FIGS. 10A to 10G are cross-sectional views showing some processes in a method of manufacturing an electronic device according to an embodiment of the inventive concept. The same/similar reference numerals are used for the same/similar components as/to the components described in FIGS. 1 to 9, and redundant descriptions are omitted.

A method of manufacturing an electronic device according to an embodiment of the inventive concept may include providing a preliminary electronic panel including a base layer, an anode, and a preliminary pixel defining film, forming a barrier rib in which a barrier rib opening is formed, patterning the preliminary pixel defining film to form a pixel defining film in which a light emitting opening is formed, forming an intermediate layer and a cathode, forming a first encapsulation layer, forming a second encapsulation layer, forming a hole passing through the first encapsulation layer and the second encapsulation layer, and forming a first conductive layer.

In addition, the method of manufacturing an electronic device according to an embodiment of the inventive concept may include forming a third encapsulation layer, forming a second conductive layer, and forming an insulating layer covering the second conductive layer.

Hereinafter, through FIGS. 10A to 10G, a method of forming light emitting elements ED, a first encapsulation layer TFE1 covering the light emitting elements ED, a second encapsulation layer TFE2, a third encapsulation layer TFE3, a first conductive layer MTL1, and a second conductive layer MTL2 will be described.

The method of manufacturing an electronic device according to an embodiment of the inventive concept may include preparing a preliminary electronic panel EPL-P. The preliminary electronic panel EPL-P may include a base layer BL, a circuit element layer DP-CL, an anode AE, a sacrificial pattern SP, and a pixel defining film PDL.

Forming a barrier rib PW on the preliminary electronic panel EPL-P according to an embodiment of the inventive concept may be further included. Specifically, the forming of the barrier rib PW may include forming a first barrier rib layer L1 (hereinafter referred to as a first layer) on the pixel defining film PDL, forming a second barrier rib layer L2 (hereinafter referred to as a second layer) on the first layer L1, a first etching process of patterning the first layer L1 and the second layer L2 to form a first pattern, and a second etching process of patterning to form an undercut in the first pattern.

The forming of each of the first layer L1 and the second layer L2 may be performed through a deposition process of conductive materials.

In the first etching process, the first layer L1 and the second layer L2 may be patterned to form a first pattern in which a first opening overlapping the anode AE is formed. In the second etching process, the first pattern may be patterned so that the first pattern formed of the first layer L1 and the second layer L2 has an undercut shape in a cross-section. That is, the undercut shape may be formed in the first layer L1 to complete the barrier rib.

The first etching process may be dry etching, and the first etching process may be performed in an etching environment in which the etching selectivity of the first layer L1 and the second layer L2 are substantially the same.

The second etching process may be wet etching, and an etchant used in the second etching process may be different from an etchant used in the first etching process. The second etching process may be performed in an environment in which the etching selectivity between the first layer L1 and the second layer L2 is high, and the first layer L1 has a greater etch rate than the second layer L2, and accordingly, an inner surface of the barrier rib PW may have an undercut shape in a cross-section.

The barrier rib PW may have a first portion P1 and a second portion P2 insulated from each other. As an example of the case in which the first portion P1 and the second portion P2 are insulated, a case in which the first portion P1 and the second portion P2 are spaced apart to be insulated from each other will be described as an example. Referring to the drawing, the first portion P1 and the second portion P2 may be provided in plurality. When viewed on a plane, a (1-1)-th portion P1-1 and a (2-1)-th portion P2-1 are spaced apart. When viewed on a plane, a (1-2)-th portion P1-2 and a (1-3)-th portion P1-3 are connected and spaced apart from a (2-2)-th portion P2-2. When viewed on a plane, a (1-4)-th portion P1-4 and a (1-5)-th portion P1-5 are connected and spaced apart from a (2-3)-th portion P2-3. When viewed on a plane, a (1-6)-th portion P1-6 and a (2-4)-th portion P2-4 are spaced apart. Each of the portions P1 and P2 is disposed in a peripheral region NPXA adjacent to light emitting regions PXA-R, PXA-G, and PXA-B.

According to an embodiment, in the depositing of the first layer L1 and the second layer L2, the first portion P1 and the second portion P2 spaced apart may be formed using a mask or the like. Alternatively, according to another embodiment, in the patterning of the first layer L1 and the second layer L2, the first pattern, in which the first portion P1 and the second portion P1 spaced apart are formed, may be formed in a region that does not overlap the anode AE. According to another embodiment, in the forming of an undercut shape in the first pattern, the first portion P1 and the second portion P2 spaced apart may be formed.

In the forming of the first portion P1 and the second portion P2 spaced apart, a plurality of grooves may be formed between the first portion P1 and the second portion P2. The plurality of grooves may each include a groove formed in the barrier rib PW and a groove formed in the pixel defining film PDL.

However, the embodiment of the inventive concept is not limited thereto, and a method of forming the first portion P1 and the second portion P2 insulated from each other may be provided in a different way, and is not limited to any one embodiment.

Accordingly, the preliminary electronic panel EPL-P including the base layer BL, the circuit element layer DP-CL, the anode AE, the sacrificial pattern SP, the pixel defining film PDL, and the barrier rib PW may be prepared.

Figure 10A:
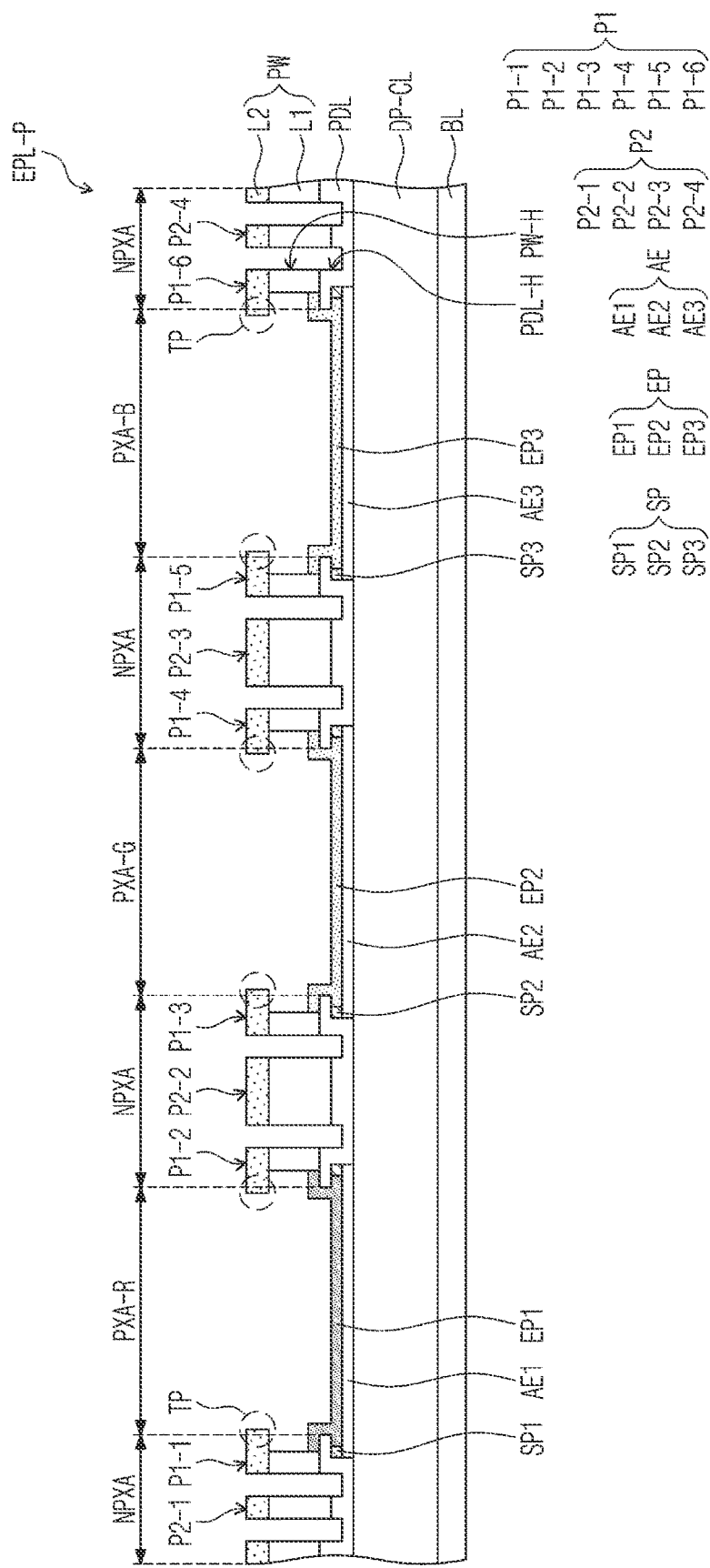
FIGS. 10A, 10B, 10C, 10D, 10E, 10F, 10G, and 10H are cross-sectional views showing some processes in a method of manufacturing an electronic device according to an embodiment of the inventive concept.
Figure 10B:
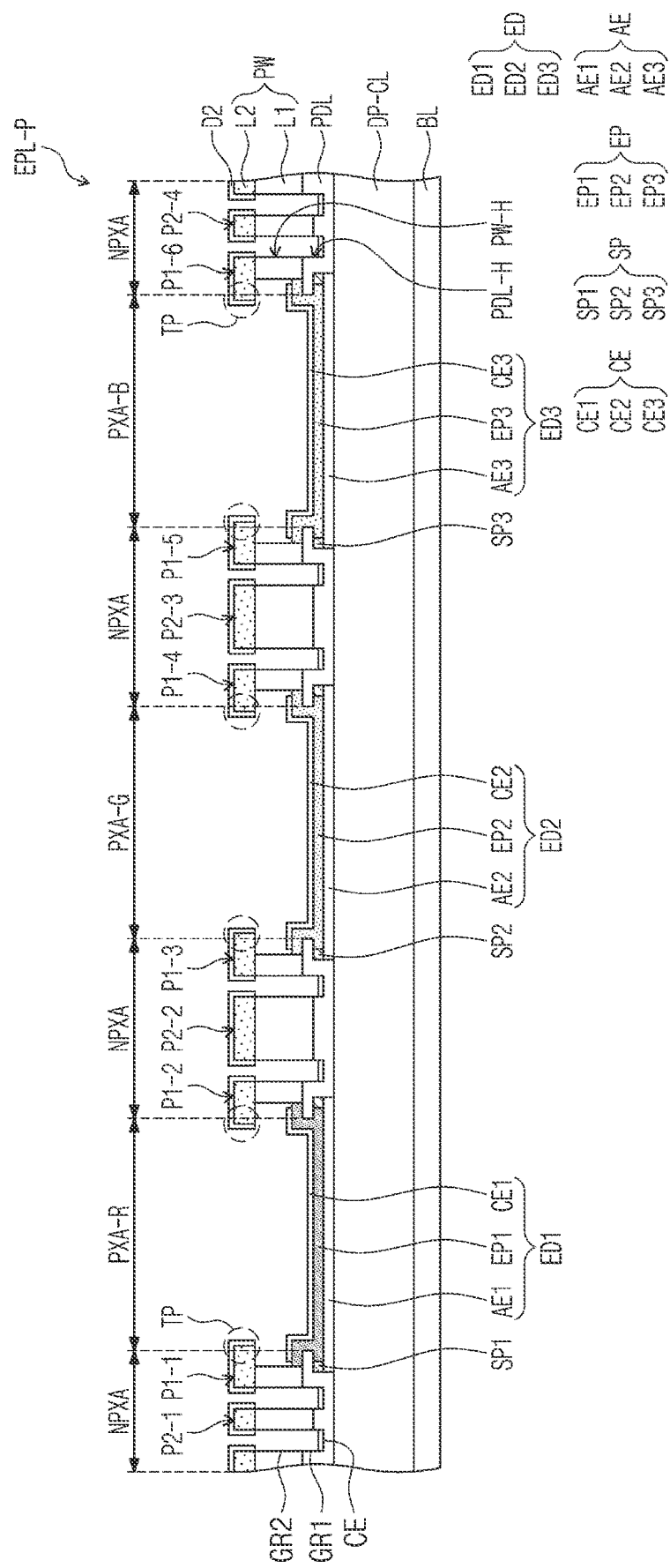

Referring to FIGS. 10A and 10B together, the method of manufacturing an electronic device according to an embodiment of the inventive concept may include forming a light emitting pattern EP and forming a cathode CE.

In this case, when a photoresist layer covering the pixel defining film PDL and the barrier rib PW is present before the forming of the light emitting pattern EP, the light emitting pattern may be formed after removing the photoresist layer.

The forming of the light emitting pattern EP and the forming of the cathode CE may each be performed through a deposition process. In an embodiment, the forming of the light emitting pattern EP may be performed through a thermal evaporation process, and the forming of the cathode CE may be performed through a sputtering process. However, the embodiment of the inventive concept is not limited thereto.

Although not shown in the drawing, forming a capping pattern covering the cathode CE may be further included. The forming of the capping pattern may be performed through a deposition process, for example, may be performed through a thermal evaporation process.

Referring to FIG. 10A, in the forming of the light emitting pattern EP, the light emitting pattern EP may be separated by a tip portion TP formed on the barrier rib PW, and may be disposed in the light emitting opening OP-E (see FIG. 7A) and the first barrier rib opening OP-P1 (see FIG. 7A). Although not shown in the drawing, in the forming of the light emitting pattern EP, a first dummy pattern spaced apart from the light emitting pattern EP and including the same material as the light emitting pattern EP may be formed on the barrier rib PW together.

Referring to FIG. 10B, in the forming of the cathode CE, the cathode CE may be separated by the tip portion TP formed on the barrier rib PW and may be disposed in the first barrier rib opening OP-P1 (see FIG. 7A). The cathode CE may be provided at a higher incident angle than the light emitting pattern EP, and may thus contact the first inner surface SL1 (see FIG. 7A) of the first layer L1. The anode AE, the light emitting pattern EP, and the cathode CE may constitute the light emitting element ED.

In the forming of the cathode CE, a portion of the cathode CE may be disposed in a groove GR1 of the pixel defining film PDL through a groove GR2 of the barrier rib PW. A portion of the cathode is disposed in the groove of the pixel defining film PDL and may not overlap the barrier rib PW in a cross-section. Accordingly, the first portion P1 and the second portion P2 may remain in a state of insulation.

Referring to the drawing, in the forming of the cathode CE, a second dummy pattern D2 spaced apart from the cathode CE may be formed on the barrier rib PW together, but the embodiment of the inventive concept is not limited thereto, and the second dummy pattern D2 may not be provided on the barrier rib PW.

Each of the light emitting elements ED1, ED2, and ED3 may be disposed in each of the light emitting regions PXA-R, PXA-G, and PXA-B. The first light emitting element ED1 may include a first anode AE1, a first cathode CE2, and a first light emitting pattern EP1, the second light emitting element ED2 may include a second anode AE2, a second cathode CE2, and a second light emitting pattern EP2, and the third light emitting element ED3 may include a third anode AE3, a third cathode CE3, and a third light emitting pattern EP3.

Figure 10C:
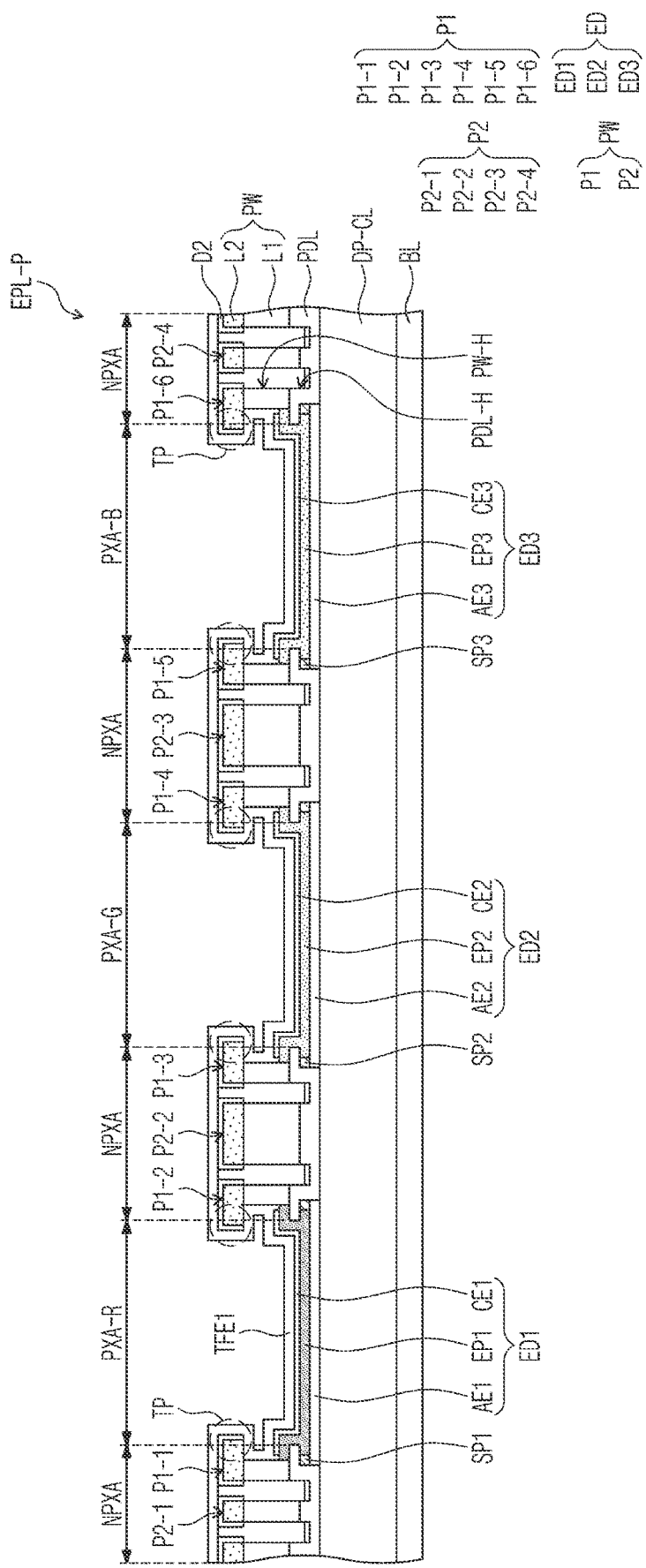

Referring to FIG. 10C, the method of manufacturing an electronic device according to an embodiment of the inventive concept may include forming a first encapsulation layer TFE1. The first encapsulation layer TFE1 may be formed through a deposition process. In an embodiment, the first encapsulation layer TFE1 may be formed through a chemical vapor deposition (CVD) process. The first encapsulation layer TFE1 may be formed on the barrier rib PW and the cathode CE, and a portion of the first encapsulation layer TFE1 may be formed inside the first barrier rib opening OP-P1.

Figure 10D:
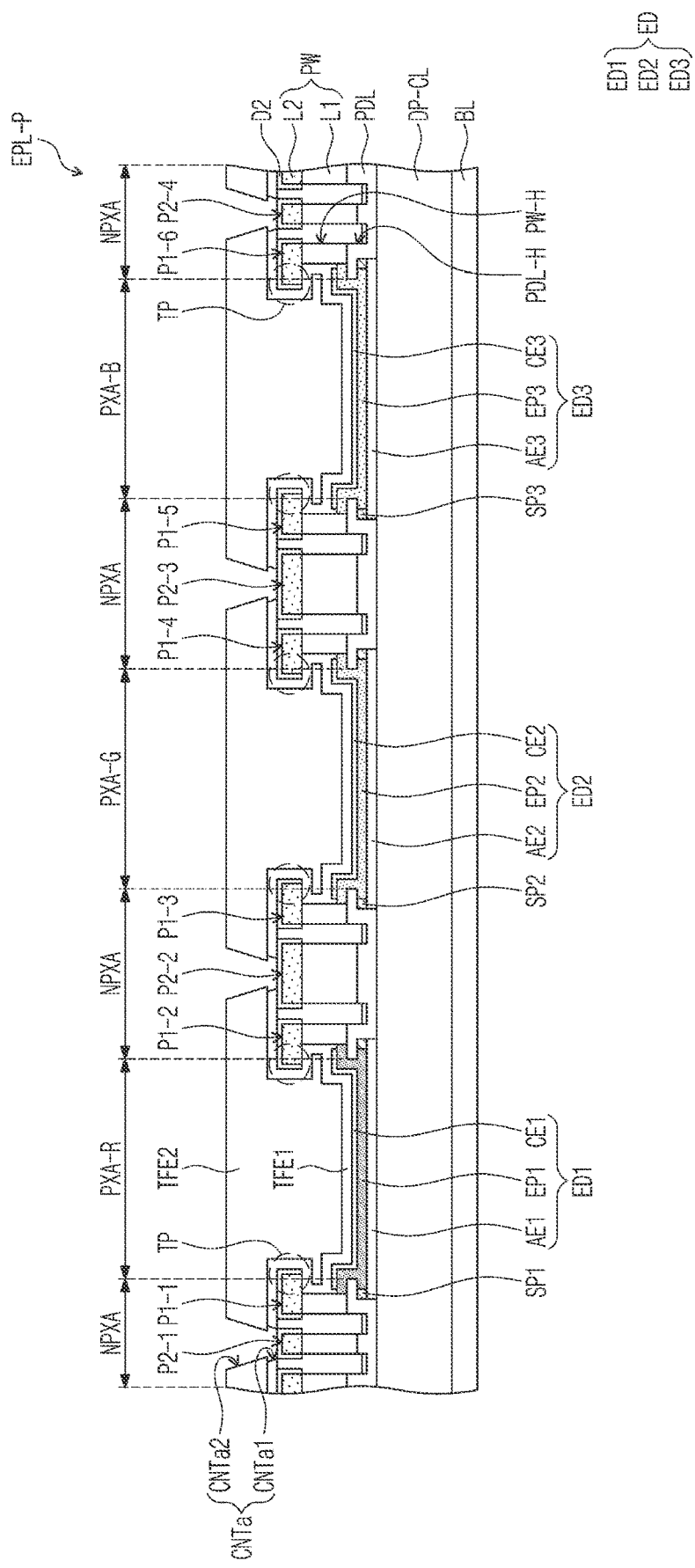

Referring to FIG. 10D, the method of manufacturing an electronic device according to an embodiment of the inventive concept may include forming a second encapsulation layer TFE2 and patterning the first encapsulation layer TFEL and the second encapsulation layer TFE2.

In the forming of the second encapsulation layer TFE2, the second encapsulation layer TFE2 may be performed through a deposition process of an organic material. The second encapsulation layer TFE2 may provide a planarized upper surface. In this case, when the second encapsulation layer TFE2 is formed through the deposition process, an organic material other than a liquid monomer may be provided.

The forming of the second encapsulation layer TFE2 may be performed at a temperature of 25° C. to 100° C. The second encapsulation layer TFE2 may be formed through the deposition process of an organic material, and the second encapsulation layer TFE2 may thus be an organic film formed at a low temperature. The second encapsulation layer TFE2 is formed at a low temperature, and thermal damage caused by high temperature to layers and detailed components below the second encapsulation layer TFE2 may be prevented.

However, the method of forming the second encapsulation layer TFE2 is not limited thereto, and the second encapsulation layer TFE2 may be formed by using an inkjet monomer method in which a liquid monomer is provided on the first encapsulation layer TFE1 to form an organic layer, and the method is not limited to any one embodiment.

In the patterning of the first encapsulation layer TFEL and the second encapsulation layer TFE2, a hole CNTa passing through the first encapsulation layer TFE1 and the second encapsulation layer TFE2 may be formed. The hole CNTa passing through the first encapsulation layer TFE1 and the second encapsulation layer TFE2 may overlap the second portion P2 of the barrier rib PW.

Figure 10E:
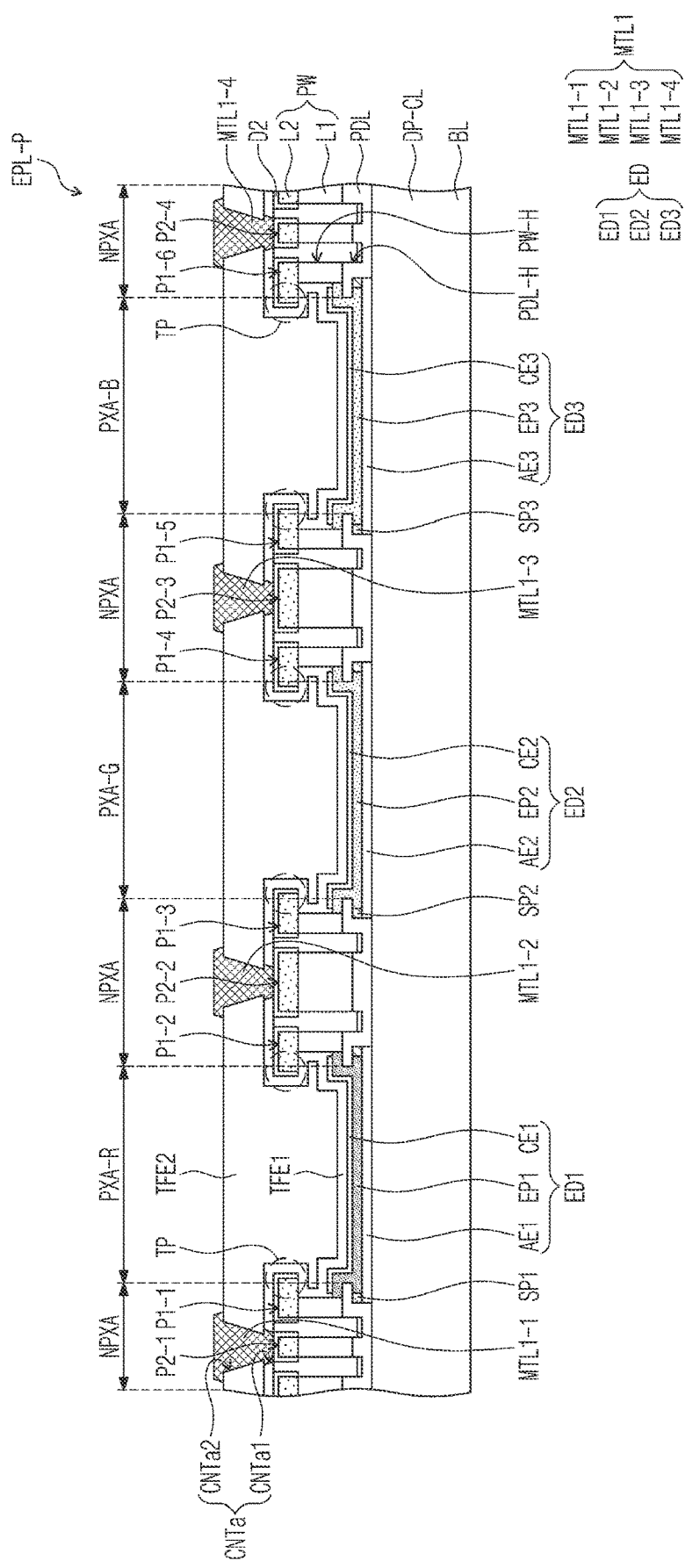

Referring to FIG. 10E, the method of manufacturing an electronic device according to an embodiment of the inventive concept may include forming a first conductive layer MTL1 and patterning the first conductive layer MTL1. The first conductive layer MTL1 may be formed on the first encapsulation layer TFE1 and the second encapsulation layer TFE2. The first conductive layer MTL1 may contact the second dummy pattern D2 through the hole CNTa1 passing through the first encapsulation layer TFE1 and the hole CNTa2 passing through the second encapsulation layer TFE2. The first conductive layer MTL1 may be electrically connected to the second portion P2 through the second dummy pattern D2. The first conductive layer MTL1 may include conductive metal layers MTL1-1, MTL1-2, MTL1-3, and MTL1-4.

Figure 10F:
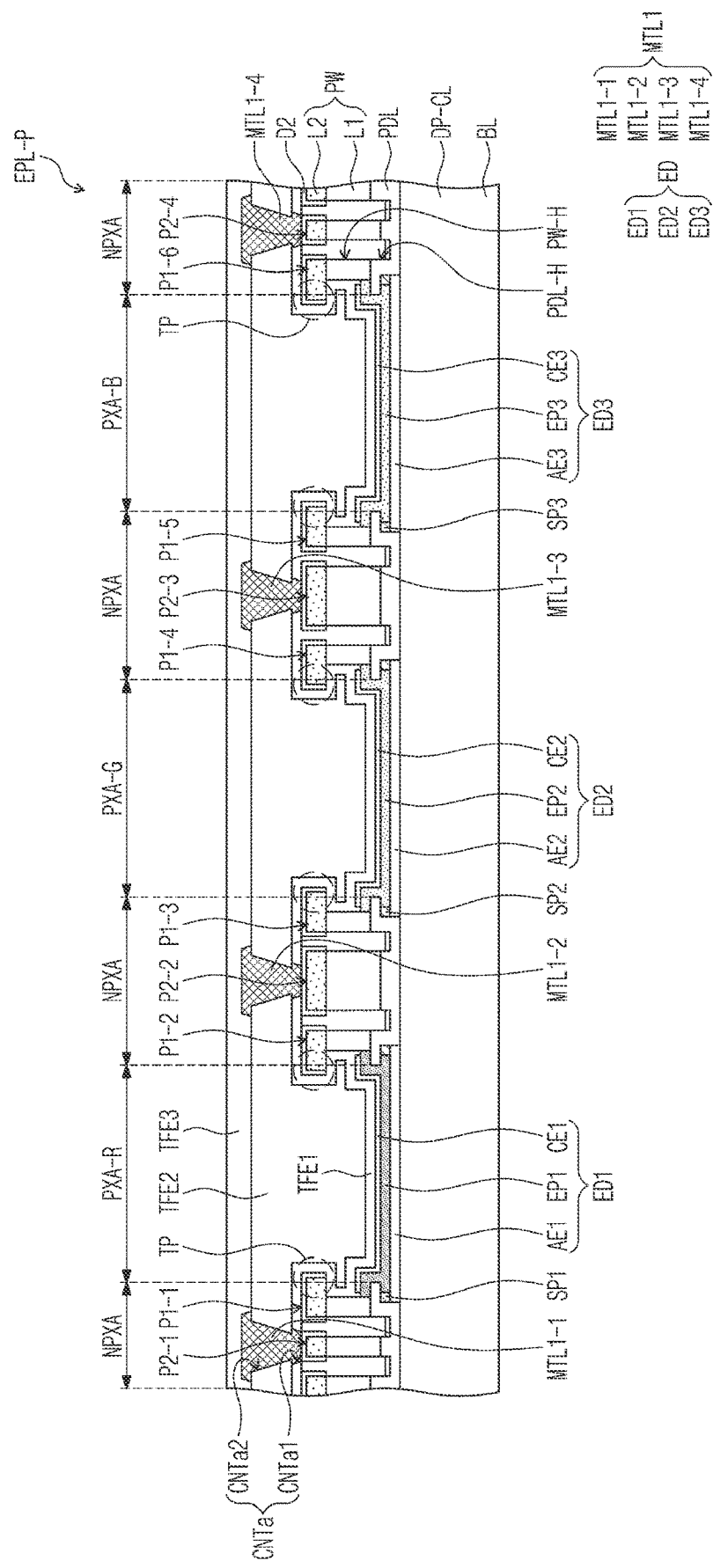
Figure 10G:
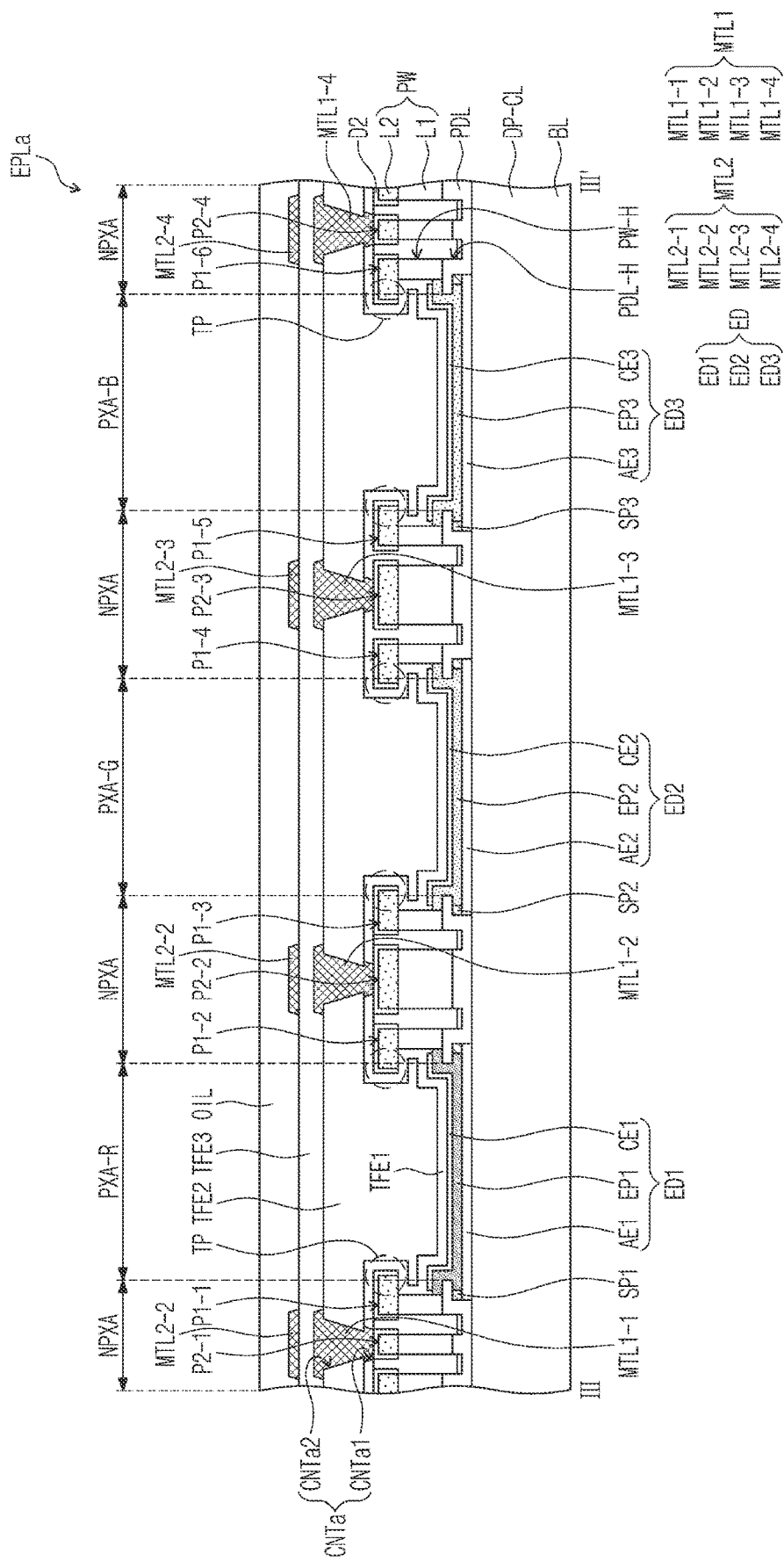

Referring to FIGS. 10F and 10G, the method of manufacturing an electronic device according to an embodiment of the inventive concept may include forming a third encapsulation layer TFE3, forming a second conductive layer MTL2, patterning the second conductive layer MTL2, and forming an insulating layer OIL. The second conductive layer MTL2 may include conductive metal layers MTL2-1, MTL2-2, MTL2-3, and MTL2-4. Through these processes described above, an electronic panel EPLa may be completed.

Specifically, the third encapsulation layer TFE3 may be formed on the second encapsulation layer TFE2 and the first conductive layer MTL1. The third encapsulation layer TFE3 may be formed through deposition of an inorganic material. The second conductive layer MTL2 may be formed on the third encapsulation layer TFE3. Thereafter, the second conductive layer MTL2 may be patterned. Then, the insulating layer OIL may be formed on the patterned second conductive layer MTL2.

The insulating layer OIL may be formed through deposition of an inorganic material. However, the embodiment of the inventive concept is not limited thereto, and an insulating layer may be formed through deposition of an inorganic material, and is not limited to any one embodiment.

In an embodiment of the inventive concept, each light emitting element is shown to be formed together, but the embodiment of the inventive concept is not limited thereto, and each light emitting element may be formed sequentially. Specifically, between the forming of a first encapsulation layer and the completing of an electronic panel, forming a barrier rib opening and a light emitting opening corresponding to light emitting regions of different colors in a barrier rib and a pixel defining film, forming light emitting elements providing different colors, and forming encapsulation layers covering the light emitting elements providing different colors, and a conductive layer may be further performed.

Figure 10H:
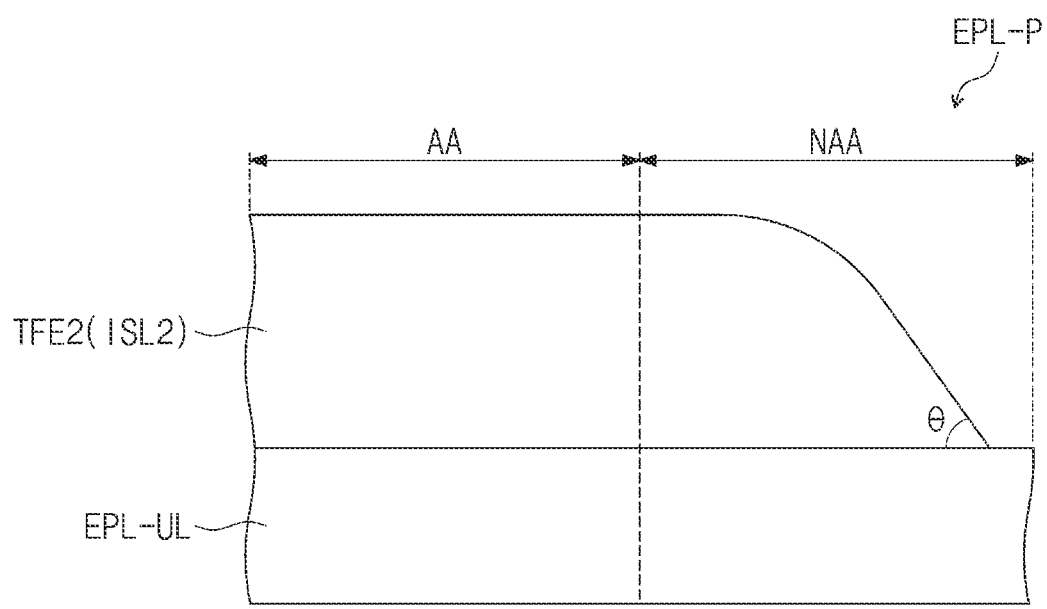

FIG. 10H is a cross-sectional view enlarging a portion of a preliminary electronic panel in the method of manufacturing an electronic panel according to an embodiment of the inventive concept. Specifically, FIG. 10H is a cross-sectional view enlarging an active region AA of the preliminary electronic panel EPL-P and a portion of the peripheral region NAA adjacent to the active region AA.

FIG. 10H shows a portion of the preliminary electronic panel EPL-P in the forming of the second encapsulation layer TFE2. The second encapsulation layer TFE2 may be disposed on a lower layer EPL-UL of the preliminary electronic panel EPL-P. The lower layer EPL-UL may be a first encapsulation layer TFE1 and a plurality of layers disposed below the first encapsulation layer TFE1.

The second encapsulation layer TFE2 may be formed on the lower layer EPL-UL through a deposition method instead of a method of providing a liquid monomer. An angle θ formed between an edge portion of the second encapsulation layer TFE2 formed in this way and a plane may be 10° or greater. Preferably, the angle θ formed between the edge portion of the second encapsulation layer TFE2 and the plane may be 60° to 70°.

Unlike what is described above, when the second encapsulation layer TFE2 is formed through an inkjet monomer method in which a liquid monomer is provided on the first encapsulation layer TFE1 to form an organic layer, the angle θ between the edge portion of the second encapsulation layer TFE2 and the plane may be less than 10°.

The second encapsulation layer TFE2 is formed through a deposition method instead of a method of providing a liquid monomer, the fluidity of the liquid monomer is not required to be considered. In addition, components such as a dam for controlling the fluidity of the liquid monomer is not required, and product downsizing (e.g., making an electronic panel that is thinner or that has a narrower peripheral region), improved economic feasibility, and improved ease of manufacturing may be achievable.

In addition, the method of forming the second encapsulation layer TFE2 through a liquid monomer method is not limited to the liquid monomer method, and the viscosity of a liquid monomer of an organic material may not be required to be greater than a predetermined value.

That is, factors that need to be considered when using a liquid monomer are not required to be considered, and a range of options for organic materials having a low permittivity may be greater. Preferably, a range of options for materials having a permittivity of 3.2 or less may be greater.

As shown in the drawing, an edge portion of the second encapsulation layer TFE2 may be disposed in the peripheral region NAA. However, the embodiment of the inventive concept is not limited thereto, and the edge portion of the second encapsulation layer TFE2 may also be disposed in the active region AA, and is not limited to any one embodiment.

Figure 11:
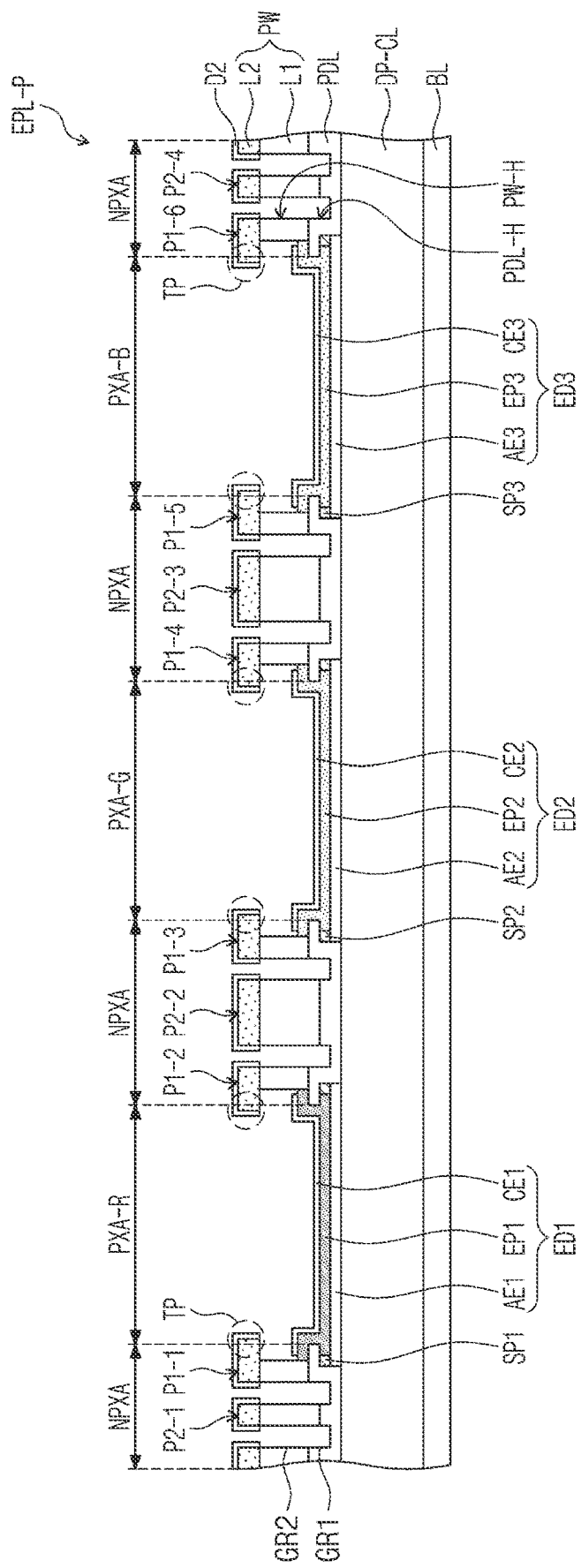
FIG. 11 is a cross-sectional view showing some processes in a method of manufacturing an electronic device according to an embodiment of the inventive concept.

FIG. 11 is a cross-sectional view showing some processes in the method of manufacturing an electronic device according to an embodiment of the inventive concept. Specifically, FIG. 11 shows a method of manufacturing an electronic device according to a different embodiment from the method of manufacturing an electronic device according to an embodiment of FIG. 10B.

Referring to FIG. 11, in the forming of the cathode CE in the method of manufacturing an electronic device according to an embodiment of the inventive concept, a portion of the cathode CE may not be disposed in a groove GR1 of the pixel defining film PDL or a groove GR2 of the barrier rib PW. In this case, there is no concern that a portion of the cathode CE is disposed in the groove of the barrier rib PW, and a state of insulation between the first portion and the second portion of the barrier rib PW may stably remain. In this case, the groove of the pixel defining film PDL may be omitted unlike what is shown in the drawing, and this is not limited to any one embodiment.

Figure 12:
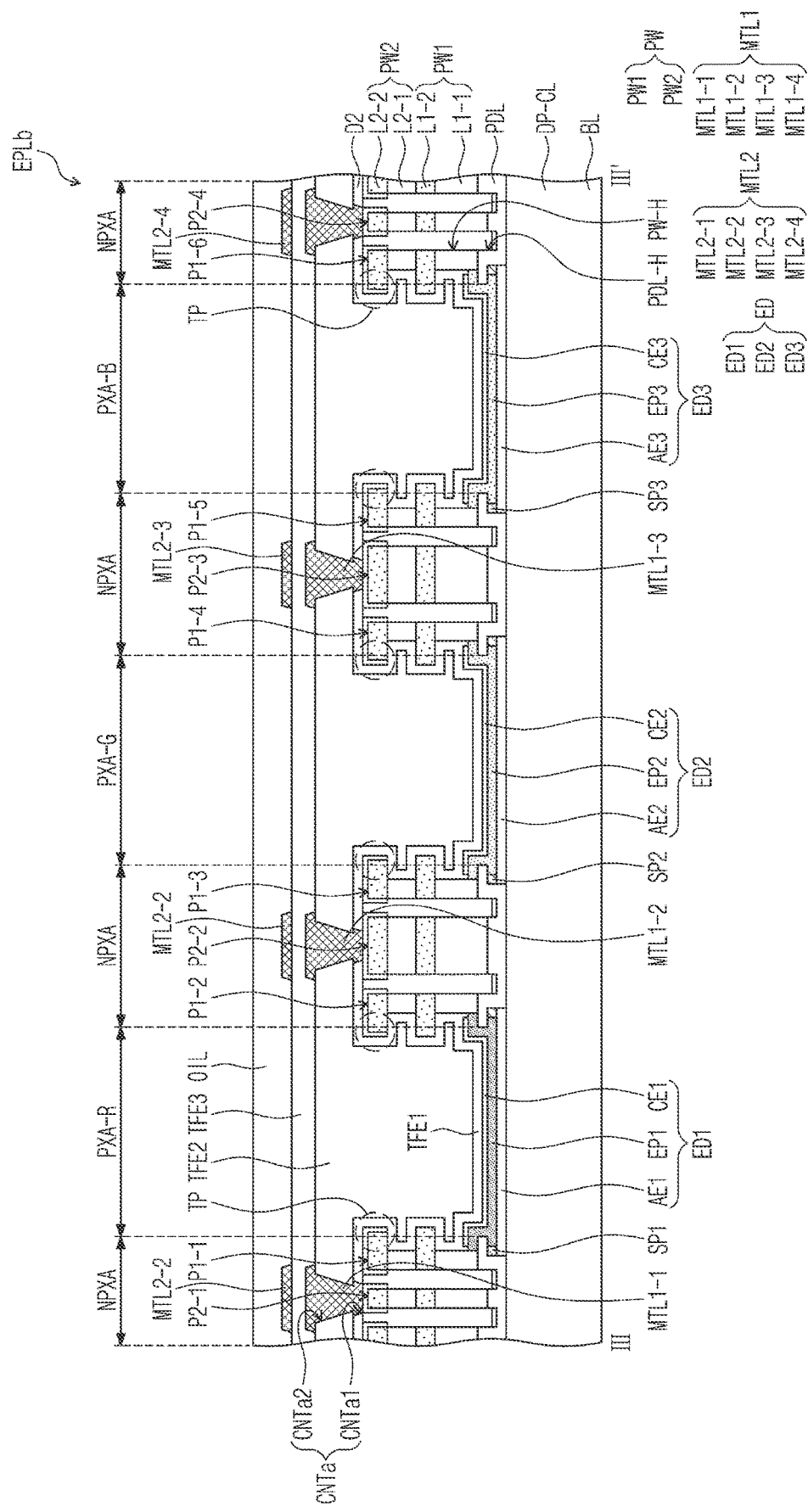
FIG. 12 is a cross-sectional view showing some processes in a method of manufacturing an electronic device according to an embodiment of the inventive concept.

FIG. 12 is a cross-sectional view showing some processes in the method of manufacturing an electronic device according to an embodiment of the inventive concept. Specifically, FIG. 12 shows a case in which the barrier rib PW includes a first barrier rib PW1 and a second barrier rib PW2 disposed on the first barrier rib PW1.

Referring to FIG. 12, the method of manufacturing an electronic device according to an embodiment of the inventive concept may further include forming a barrier rib PW including a first barrier rib PW1 and a second barrier rib PW2 on the preliminary electronic panel EPL-P.

Specifically, the forming of the barrier rib PW may include sequentially forming a first lower layer L1-1, a first upper layer L1-2, a second lower layer L2-1, and a second upper layer L2-2 on the pixel defining film PDL, a first etching process of patterning each of layers L1-1, L1-2, L2-1, and L2-2 to form a first pattern, and a second etching process of patterning to form an undercut in the first pattern.

The forming of each of the layers L1-1, L1-2, L2-1, and L2-2 may be performed through a deposition process of conductive materials.

In the first etching process, the first lower layer L1-1 and the first upper layer L1-2 may be patterned to form a first pattern in which a lower opening overlapping the anode AE is formed, and the second lower layer L2-1), and the second lower layer L2-1 and the second upper layer L2-2 may be patterned to form a second pattern in which an upper opening overlapping the anode AE is formed.

In the second etching process, the first pattern and the second pattern may be patterned so that the first pattern and the second pattern have an undercut shape in a cross-section. That is, the undercut shape may be formed in the first lower layer L1-1 and the second lower layer L2-1 to complete the barrier rib PW.

The embodiment of the inventive concept is not limited to what is described above, after the forming of the second barrier rib PW2 having an undercut shape in a cross-section by patterning the second lower layer L2-1 and the second upper layer L2-2, forming the first barrier rib PW1 having an undercut shape in a cross-section by patterning the first lower layer L1-1 and the first upper layer L1-2 may be performed, and this is not limited to any one embodiment.

According to an embodiment, in the sequentially depositing of each of the layers L1-1, L1-2, L2-1, and L2-2, the first portion P1 and the second portion P2 spaced apart may be formed using a mask or the like. According to another embodiment, in the patterning of each of the layers L1-1, L1-2, L2-1, and L2-2, the first pattern and the second pattern, in which the first portion P1 and the second portion P1 spaced apart are formed, may be formed in a region that does not nonoverlap the anode AE. According to another embodiment, in the forming of an undercut shape in the first pattern and the second pattern, the first portion P1 and the second portion P2 spaced apart may be formed.

However, the embodiment of the inventive concept is not limited thereto, and the method of forming the first portion P1 and the second portion P2 insulated from each other may be provided in a different way, and is not limited to any one embodiment.

In an electronic device according to an embodiment of the inventive concept, some components of an input sensor may be disposed between components of an electronic panel, and accordingly, issues such as electrical interference between the components may be addressed.

An electronic device according to an embodiment of the inventive concept may improve integration among a plurality of components in a cross-section.

An electronic device according to an embodiment of the inventive concept may provide product downsizing.

In a method of manufacturing an electronic device according to an embodiment of the inventive concept, some components of an input sensor may be formed in a process of manufacturing an electronic panel, and accordingly, process steps and costs may be reduced.

Although the present disclosure has been described with reference to embodiments of the inventive concept, it will be understood that the inventive concept should not be limited to these embodiments but various changes and modifications may be made by those skilled in the art without departing from the spirit and scope of the present disclosure. Hence, the technical scope of the present disclosure is not limited to the detailed descriptions in the specification but should be determined with reference to the claims.

What is claimed is:
1. An electronic device comprising:
    a base layer;
    a pixel defining film disposed on the base layer and having
        a light emitting opening defined therein;
    a barrier rib disposed on the pixel defining film, having
        conductivity, and including a first portion having a first barrier rib opening corresponding to the light emitting opening and a second portion insulated from the first portion;

a light emitting element disposed in the light emitting opening and including an anode, an intermediate layer disposed on the anode, and a cathode disposed on the intermediate layer and connected to the first portion;

a first encapsulation layer covering the cathode;

a second encapsulation layer covering the light emitting opening and the first barrier rib opening;

a third encapsulation layer disposed on the second encapsulation layer; and a sensor disposed on the light emitting element and including a first sensor electrode and a second sensor electrode, wherein the sensor includes:

a first conductive layer disposed between the second encapsulation layer and the third encapsulation layer; and a second conductive layer disposed on the third encapsulation layer, and the first conductive layer is electrically connected to the second portion through the first encapsulation layer.

2. The electronic device of claim 1, wherein in the barrier rib when viewed on a plane, a second barrier rib opening spaced apart from the first barrier rib opening is defined, the second portion overlaps the second barrier rib opening, and the first portion and the second portion are spaced apart.

3. The electronic device of claim 1, wherein a distance between the first portion and the second portion is less than or equal to a thickness of the first encapsulation layer.

4. The electronic device of claim 1, wherein an air layer is disposed between the first portion and the second portion.

5. The electronic device of claim 1, wherein at least one of an inorganic material or an organic material is disposed between the first portion and the second portion.

6. The electronic device of claim 1, wherein a plurality of grooves spaced apart are defined between the first portion and the second portion.

7. The electronic device of claim 1, wherein the first sensor electrode comprises:

a plurality of first sensor patterns arranged along a first direction; and a plurality of first connection patterns arranged along the first direction and each disposed between the first sensor patterns to connect adjacent first sensor patterns among the first sensor patterns, the second sensor electrode comprises:

a plurality of second sensor patterns arranged along a second direction crossing the first direction; and a plurality of second connection patterns arranged along the second direction and each disposed between the second sensor patterns to connect adjacent second sensor patterns among the second sensor patterns, and the first connection patterns and the second connection patterns are disposed on different layers.

8. The electronic device of claim 7, wherein the first sensor patterns and the second sensor patterns are disposed on different layers.

9. The electronic device of claim 1, wherein the barrier rib comprises:

a lower layer including a conductive material; and an upper layer disposed on the lower layer and including a conductive material.

10. The electronic device of claim 1, wherein the first portion has an undercut shape in a cross-section, and the cathode is in contact with the first portion.

11. The electronic device of claim 1, wherein the barrier rib comprises:

a first barrier rib disposed on the pixel defining film and defining a lower barrier rib opening; and a second barrier rib disposed on the first barrier rib and defining an upper barrier rib opening overlapping the lower barrier rib opening.

12. The electronic device of claim 11, wherein the first barrier rib comprises:

a first lower layer including a conductive material; and a first upper layer disposed on the first lower layer and including a conductive material, and the second barrier rib comprises:

a second lower layer disposed on the first upper layer and including a different material from the first upper layer; and a second upper layer disposed on the second lower layer and including a conductive material.

13. The electronic device of claim 12, wherein the first lower layer and the second lower layer have an undercut shape in a cross-section, and the cathode is in contact with the first lower layer.

14. The electronic device of claim 1, wherein the pixel defining film has an undercut shape in a cross-section.

15. An electronic device comprising:

a base layer;

a pixel defining film disposed on the base layer and having a light emitting opening defined therein;

a barrier rib disposed on the pixel defining film, having conductivity, and having a barrier rib opening corresponding to the light emitting opening defined therein;

a light emitting element disposed in the light emitting opening and including an anode, an intermediate layer disposed on the anode, and a cathode disposed on the intermediate layer and connected to the barrier rib;

a first encapsulation layer covering the cathode;

a second encapsulation layer covering the light emitting opening and the barrier rib opening;

a first conductive layer disposed on the second encapsulation layer;

a third encapsulation layer disposed on the second encapsulation layer; and a second conductive layer disposed on the third encapsulation layer, wherein the barrier rib includes:

a first portion connected to the cathode; and a second portion insulated from the first portion and connected to the first conductive layer.

16. The electronic device of claim 15, wherein at least a portion of the first conductive layer passes through the first encapsulation layer and the second encapsulation layer and contacts the second portion.

17. The electronic device of claim 15, wherein a distance between the first portion and the second portion is less than or equal to a thickness of the first encapsulation layer.

18. The electronic device of claim 15, wherein an air layer is disposed between the first portion and the second portion.

19. The electronic device of claim 15, wherein the first portion has an undercut shape in a cross-section, and the cathode is in contact with the first portion.

20. A method of manufacturing an electronic device, the method comprising:

providing a preliminary electronic panel including a base layer, an anode disposed on the base layer, and a preliminary pixel defining film disposed on the base layer and covering the anode;

forming a barrier rib disposed on the preliminary pixel defining film and including a first portion forming a barrier rib opening and having an undercut shape, and a second portion spaced apart from the first portion;

patterning the preliminary pixel defining film to form a plurality of light emitting openings overlapping the barrier rib opening and exposing at least a portion of the anode so as to form a pixel defining film;

forming an intermediate layer including a light emitting material in the barrier rib opening, and a cathode contacting the first portion;

forming a first encapsulation layer covering the cathode;

forming a second encapsulation layer covering the first encapsulation layer;

forming a hole passing through the first encapsulation layer and the second encapsulation layer; and forming a first conductive layer connected to the second portion through the hole on the second encapsulation layer.

21. The method of claim 20, further comprising forming a third encapsulation layer covering the first conductive layer; and forming a second conductive layer on the third encapsulation layer.

22. The method of claim 20, wherein in the forming of the second encapsulation layer, the first encapsulation layer is deposited with an organic material to form the second encapsulation layer.

23. The method of claim 22, wherein the forming of the second encapsulation layer is performed at a temperature of 25° C. to 100° C.

24. The method of claim 22, wherein an angle formed between an edge portion of the second encapsulating layer and a plane is 10° to 70°.

25. The method of claim 20, wherein the forming of the barrier rib comprises:

forming a first layer on the pixel defining film;

forming a second layer on the first conductive layer;

a first etching process of patterning the first layer and the second layer to form a first pattern; and a second etching process of patterning to form an undercut in the first pattern.

26. The method of claim 20, wherein the forming of the barrier rib comprises:

forming a first lower layer on the pixel defining film;

forming a first upper layer on the first lower layer;

forming a second lower layer on the first upper layer;

forming a second upper layer on the second lower layer;

a first etching process of patterning the first lower layer and the first upper layer to form a first pattern and patterning the second lower layer and the second upper layer to form a second pattern; and a second etching process of patterning to form an undercut in each of the first pattern and the second pattern.

* * * * *